US009160284B2

United States Patent
Matsumoto et al.

(10) Patent No.: US 9,160,284 B2
(45) Date of Patent: Oct. 13, 2015

(54) SYSTEMS AND METHODS FOR BIASING AMPLIFIERS USING ADAPTIVE CLOSED-LOOP CONTROL AND ADAPTIVE PREDISTORTION

(71) Applicant: Aviant U.S., Inc., Santa Clara, CA (US)

(72) Inventors: Frank Matsumoto, San Ramon, CA (US); Youming Qin, Sunnyvale, CA (US); Cuong Nguyen, San Jose, CA (US); Andres Goytia, Santa Clara, CA (US)

(73) Assignee: Aviat U.S., Inc., Santa Clara, CA (US)

( * ) Notice: Subject to any disclaimer, the term of this patent is extended or adjusted under 35 U.S.C. 154(b) by 0 days.

(21) Appl. No.: 14/225,227

(22) Filed: Mar. 25, 2014

(65) Prior Publication Data
US 2014/0210558 A1    Jul. 31, 2014

Related U.S. Application Data

(63) Continuation-in-part of application No. 14/150,721, filed on Jan. 8, 2014.

(60) Provisional application No. 61/805,478, filed on Mar. 26, 2013, provisional application No. 61/750,308, filed on Jan. 8, 2013.

(51) Int. Cl.
| | |
|---|---|
| H03G 3/10 | (2006.01) |
| H03F 1/26 | (2006.01) |
| H03F 3/04 | (2006.01) |
| H03F 3/19 | (2006.01) |
| H03F 3/21 | (2006.01) |
| H03F 1/02 | (2006.01) |
| H03F 1/32 | (2006.01) |

(52) U.S. Cl.
CPC ............... *H03F 3/19* (2013.01); *H03F 1/0272* (2013.01); *H03F 1/3247* (2013.01); *H03F 3/21* (2013.01); *H03F 2200/15* (2013.01); *H03F 2200/462* (2013.01)

(58) Field of Classification Search
USPC ................................ 330/285, 149, 296, 291
IPC ............................. H03G 3/10; H03F 1/26,3/04
See application file for complete search history.

(56) References Cited

U.S. PATENT DOCUMENTS

| | | | |
|---|---|---|---|
| 4,463,272 | A | 7/1984 | Tucker |
| 4,924,191 | A | 5/1990 | Erb et al. |

(Continued)

FOREIGN PATENT DOCUMENTS

| | | |
|---|---|---|
| GB | 2401264 | 11/2004 |

OTHER PUBLICATIONS

International Application No. PCT/US20141010758, International Search Report and Written Opinion mailed May 2, 2014.

(Continued)

*Primary Examiner* — Patricia T Nguyen
(74) *Attorney, Agent, or Firm* — Sheppard, Mullin, Richter & Hampton LLP

(57) ABSTRACT

Various embodiments described herein provide systems and methods for improved performance for power amplifiers, particularly GaN power amplifiers. According to some embodiments, a power amplifier (e.g., GaN power amplifier) utilizes adaptive predistortion and adaptive closed-loop control of the drain current of the power amplifier to achieve improved power amplifier performance.

27 Claims, 12 Drawing Sheets

(56) References Cited

U.S. PATENT DOCUMENTS

| | | | |
|---|---|---|---|
| 5,426,641 A * | 6/1995 | Afrashteh et al. | 370/347 |
| 5,451,907 A | 9/1995 | Keane et al. | |
| 5,886,575 A | 3/1999 | Long | |
| 6,043,706 A | 3/2000 | Nowak et al. | |
| 6,049,704 A * | 4/2000 | Peckham et al. | 455/232.1 |
| 6,178,313 B1 | 1/2001 | Mages et al. | |
| 6,304,145 B1 | 10/2001 | Laureanti et al. | |
| 6,351,189 B1 | 2/2002 | Hirvilampi | |
| 6,424,211 B1 | 7/2002 | Nolan et al. | |
| 6,515,545 B1 | 2/2003 | Hu et al. | |
| 6,549,068 B1 | 4/2003 | Bollenbeck | |
| 6,603,356 B1 * | 8/2003 | Kim et al. | 330/265 |
| 6,614,309 B1 | 9/2003 | Pehlke | |
| 7,268,626 B2 | 9/2007 | Anand | |
| 8,195,103 B2 | 6/2012 | Waheed et al. | |
| 8,295,794 B2 | 10/2012 | Agarwal | |
| 2002/0171478 A1 * | 11/2002 | Wouters | 330/69 |
| 2002/0183019 A1 * | 12/2002 | Dent et al. | 455/108 |
| 2003/0160654 A1 | 8/2003 | Fischer et al. | |
| 2003/0201834 A1 | 10/2003 | Pehlke | |
| 2005/0270054 A1 * | 12/2005 | Van Hees | 324/765 |
| 2006/0132230 A1 | 6/2006 | Douglas | |
| 2008/0002983 A1 | 1/2008 | Ishikawa et al. | |
| 2008/0125061 A1 | 5/2008 | Kuriyama et al. | |
| 2010/0151804 A1 | 6/2010 | Song et al. | |
| 2010/0273431 A1 * | 10/2010 | Fraser et al. | 455/67.11 |
| 2011/0221523 A1 | 9/2011 | Dupis et al. | |
| 2011/0279185 A1 | 11/2011 | Lautzenhiser | |
| 2012/0313709 A1 | 12/2012 | Lautzenhiser | |
| 2012/0326778 A1 | 12/2012 | Nadimpalli et al. | |
| 2014/0118074 A1 | 5/2014 | Levesque et al. | |

OTHER PUBLICATIONS

International Application No. PCT/US20141031914, International Search Report and Written Opinion mailed Aug. 11, 2014.
International Application No. PCT/US20141017190, International Search Report and Written Opinion mailed May 30, 2014.

* cited by examiner

SYSTEMS AND METHODS FOR BIASING AMPLIFIERS USING ADAPTIVE CLOSED-LOOP CONTROL AND ADAPTIVE PREDISTORTION

CROSS-REFERENCE TO RELATED APPLICATIONS

The present application is a continuation-in-part of U.S. patent application Ser. No. 14/150,721, filed Jan. 8, 2014 and entitled "Systems and Methods for Biasing Amplifiers with Adaptive Closed Loop Control," which claims the benefit of U.S. Provisional Patent Application Ser. No. 61/750,308, filed Jan. 8, 2013 and entitled "System and Method for Biasing GaN Amplifiers with Adaptive Closed Loop Control," each of which is incorporated by reference herein. The present application also claims the benefit of U.S. Provisional Patent Application Ser. No. 61/805,478, filed Mar. 26, 2013 and entitled "RF/Microwave Transmitter Utilizing Cascaded GaN Amplifiers with Dynamic Biasing Control and Adaptive Pre-Distorter for High-Order QAM Signal Transmissions," which is incorporated by reference herein.

BACKGROUND

1. Technical Field

Some embodiments of the present invention(s) relate to power amplifiers, and more particularly, some embodiments relate to systems and methods for improved power amplifier performance.

2. Description of Related Art

Radio frequency (RF) power amplifiers and devices using Gallium Nitride (GaN) benefit over those using technologies such as gallium arsenide (GaAs). For example, GaN-based power amplifiers have exceptional power density (i.e., increased power per square millimeter of die) and exceptional power efficiency characteristics. Unfortunately, one of the challenges of using GaN-based power amplifiers is controlling the quiescent drain current ($I_q$) of such power amplifiers over time. FIG. 1 provides a chart depicting the drift of the quiescent drain current ($I_{dq}$) of an example GaN power amplifier over time. Such drift impacts certain systems, because as the quiescent drain current ($I_{dq}$) of a GaN power amplifier changes, so does the performance of the GaN power amplifier. One solution to this is a "burn-in" procedure, whereby a GaN power amplifier is energized until the quiescent drain current ($I_{dq}$) of the GaN power amplifier stabilizes. The "burn-in" procedure is time consuming, it is difficult to tell how much time will be required for $I_{dq}$ stabilization in GaN power amplifiers (as it is difficult to predict the drift of the quiescent drain current over long periods of time), and a GaN power amplifier cannot be biased at a constant drain current for its drain current varies according with its RF power output.

Another one of the challenge affecting GaN amplifiers used in radio frequency (RF) transmitters (e.g., microwave transmitters) that need to comply with regulatory requirements, such as those of the European Telecommunications Standards Institute (ETSI), Unite States Federal Communications Commission (FCC), and the American National Standards Institute (ANSI). Since GaN devices, such as GaN amplifiers, do not operate as in class-A operation (i.e., linear operation), RF transmitters that utilize GaN devices and operate on a high-order quadrature amplitude module (QAM) have difficulty operating in compliance with regulatory requirements.

SUMMARY OF EMBODIMENTS

Various embodiments described herein provide systems and methods for improved performance for power amplifiers, particularly GaN power amplifiers. According to some embodiments, a power amplifier (e.g., GaN power amplifier) utilizes adaptive predistortion and adaptive closed-loop control of the drain current of the power amplifier to achieve improved power amplifier performance. In various embodiments, systems and methods involve using a power amplifier in a calibration phase and an operation phase, where the power amplifier receives a non-predistorted input signal during the calibration phase, and where the power amplifier receives a predistorted input signal during an operation phase. During the calibration phase, a set of optimized quiescent drain current values may be determined for the power amplifier, and a set of calibrated drain current values may be determined for the power amplifier. During operation phase, the power amplifier may utilize one or more of the set of optimized quiescent drain current values or one or more of the set of calibrated drain current values.

In some embodiments, systems and methods determine an optimized quiescent drain current value for a drain current of a power amplifier while the power amplifier is operating under an operational parameter and while a power amplifier input signal received by the power amplifier is based on a first non-predistorted signal. Systems and methods may store the optimized quiescent drain current value as saved drain current data. Storing the optimized quiescent drain current value may comprise storing the optimized quiescent drain current value in association with the operational parameter. As used herein, a first signal based may be based on a second signal if the first and second signals are part of a signal processing path and the second signal precedes the first signal in the signal processing path.

In some embodiments, systems and methods determine a set of calibrated drain current values for a drain current of a power amplifier. For some embodiments, the set of calibrated drain current values is calibrated for a set of power levels for a power amplifier output signal while the power amplifier is operating under the operational parameter and while the power amplifier input signal received by the power amplifier is based on a second non-predistorted signal. Systems and methods may store the set of calibrated drain current values as saved drain current data. Storing the set of calibrated drain current values may comprise storing the set of calibrated drain current values in association with the operational parameter or the set of power levels.

In some embodiments, systems and methods compare a present drain current value of a drain current of a power amplifier, to a particular drain current value in saved drain current data, while the power amplifier input signal received by the power amplifier is based on a predistorted signal. Systems and methods may determine whether the comparing the present current value to the particular current value satisfies a condition. Systems and methods may adjust the drain current based on the particular drain current value if the condition is determined to be satisfied. Adjusting the drain current based on the calibrated drain current may comprise adjusting the drain current to match or substantially match the particular drain current value from the saved drain current data. In addition, adjusting the drain current based on the calibrated drain current may comprise adjusting a voltage bias of the power amplifier such that the drain current matches or substantially matches the particular drain current value from the saved drain current data.

In some embodiments, the first non-predistorted signal is generated by disabling generation of the predistorted signal by a predistorter module. In some embodiments, the second non-predistorted signal is generated by disabling generation of the predistorted signal by a predistorter module. In some embodiments, the predistorted signal is (adaptively) generated by a predistorter module configured to detect existing distortion in an initial signal and to generate the predistorted signal based on the detected existing distortion. Additionally, in some embodiments, the systems and methods enable generation of the predistorted signal by the predistorter module, disable generation of the predistorted signal by the predistorter module, or both. Systems and methods may enable generation of the predistorted signal by the predistorter module when the power amplifier is in operation phase, systems and methods may disable generation of the predistorted signal by the predistorter module when the power amplifier is in calibration phase (e.g., determining a set of quiescent or calibrated drain current values for the power amplifier).

In some embodiments, the operational parameter comprises a plurality of operational parameters. For example, the operational parameter may comprise a frequency of the power amplifier input signal, a phase of the power amplifier input signal, a power level of the power amplifier input signal, or a temperature of the power amplifier.

Depending on the embodiment, the condition may be that a difference between the drain current and the particular drain current value from the saved drain current data is less than, equal to, or larger than a predetermined value.

According to various embodiments, a system comprises a transmitter or transceiver that includes some or all of the components or functionality described herein. Additionally, some embodiments provide for a method that performs various steps and operations described herein, or provide for a computer program product comprising a computer readable medium having computer program code (i.e., executable instructions) executable by a processor to perform various steps and operations described herein. For example, the systems and methods described herein may be implemented, in whole or in part, as a microcontroller that operates in connection with a power amplifier.

BRIEF DESCRIPTION OF THE DRAWINGS

The drawings are provided for purposes of illustration only and merely depict typical or example embodiments. These drawings are provided to facilitate the reader's understanding and shall not be considered limiting of the breadth, scope, or applicability various embodiments.

Figure 1:
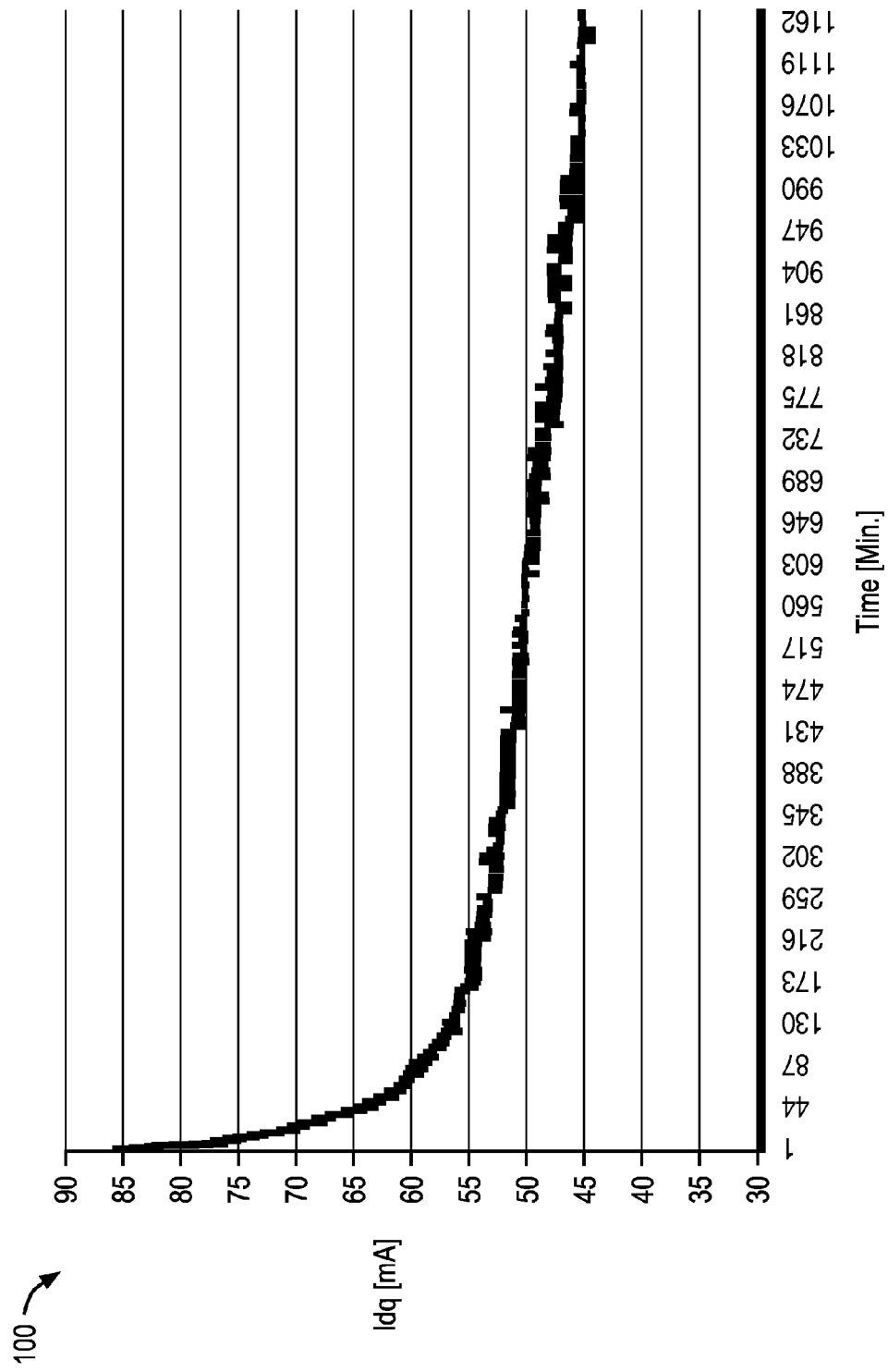
FIG. 1 is a chart depicting a drift of a quiescent drain current ($I_{dq}$) of a power amplifier over time.

The figures are not intended to be exhaustive or to limit the embodiments to the precise form disclosed. It should be understood that various embodiments may be practiced with modification and alteration.

DETAILED DESCRIPTION OF VARIOUS EMBODIMENTS

Various embodiments described herein provide systems and methods for improved performance for power amplifiers, particularly GaN power amplifiers. According to some embodiments, a power amplifier (e.g., GaN power amplifier) utilizes adaptive predistortion and adaptive closed-loop control of a drain current of the power amplifier to achieve improved power amplifier performance. In various embodiments, systems and methods involve using a power amplifier in a calibration phase and an operation phase, where the power amplifier receives a non-predistorted input signal during the calibration phase, and where the power amplifier receives a predistorted input signal during an operation phase. During the calibration phase, a set of optimized quiescent drain current values may be determined for the power amplifier, and a set of calibrated drain current values may be determined for the power amplifier. During operation phase, the power amplifier may utilize one or more of the set of optimized quiescent drain current values or one or more of the set of calibrated drain current values.

Systems and methods described may also utilize adaptive predistortion to reduce distortion in an output signal of the power amplifier, including intermodulation distortion (IMD). Systems and methods described may control the drain current using a closed-loop control when the power amplifier operates at an output power level much lower than its power compression point ($P_{sat}$) and may control the drain current to handle situations where the drain current changes dramatically with changes to the power level of the power amplifier's output signal (e.g., in an radio frequency (RF) transmitter, the RF power level provided by the power amplifier). Systems and methods may control the drain current to be biased such that the power amplifier operates in a non-Class A condition.

Various embodiments apply to a power amplifier having an input signal, an output signal, and a drain current. The power amplifier may be a GaN power amplifier, which may be operated a power amplifier or a driver amplifier. Various embodiments utilize the observation that the drain current ($I_d$) of a GaN power amplifier varies proportionally to the quiescent drain current ($I_{dq}$) of the GaN power amplifier, particularly when for the GaN amplifier operating lower than its power compression point ($P_{sat}$). A GaN power amplifier may, for instance, operate lower than its power compression point ($P_{sat}$) where the GaN power amplifier is used in linear modulation applications (e.g., 256 QAM modulation). For some embodiments, an adaptive closed-loop control can leverage the proportional variation between the drain current ($I_d$) and the quiescent drain current ($I_{dq}$) and control the GaN power amplifier accordingly, particularly with respect to controlling the quiescent drain current ($I_{dq}$) of the GaN power amplifier.

According to some embodiments, an adaptive closed-loop control is utilized with a power amplifier to control the drain current of the power amplifier during two phases: a calibration phase and an operation phase. During the calibration phase, various embodiments gather and save information (e.g., a datastore or map) regarding drain current values of a power amplifier during quiescent operation and non-quiescent operation, and while the power amplifier is operating under one or more operational parameters (e.g., input frequency, input phase, temperature, output power level, etc.). During the operation phase, various embodiments utilize information saved from the calibration phase to adaptively control the drain current of the power amplifier, during quiescent operation and non-quiescent operation, based on present operational parameters of the power amplifier. In doing so, optimal or near optimal operation can be achieved for applications of the power amplifier, and with predictable behavior of the drain current of the power amplifier.

For various embodiments, dynamic control (e.g., adjustment) of a drain current of a given power amplifier is achieved by dynamically controlling (e.g., adjusting) a bias of the power amplifier. For some embodiments, the power amplifier bias being dynamically controlled is associated with a gate of the given power amplifier (e.g., a gate voltage). Additionally, in some embodiments, controlling a drain current of a given power amplifier comprises measuring the drain current as the bias of the given power amplifier is controlled.

During the calibration phase, a quiescent drain current ($I_{dq}$) of the power amplifier may be optimized for the performance requirements of a particular application of the power amplifier. For example, where a power amplifier is being used in a transmitter, such as a radio frequency unit such as the one depicted and described herein with respect to FIG. 2, the quiescent drain current ($I_{dq}$) of the power amplifier may be optimized for a transmission spectrum that meets regulatory (e.g., FCC) requirements of the transmitter and performance requirements of the transmitter (e.g., amplifying RF signals at microwave frequencies).

Optimizing the quiescent drain current ($I_{dq}$) of the power amplifier may comprise determining one or more quiescent drain current ($I_{dq}$) values for the power amplifier for one or more operational parameters under which the power amplifier may be operated, or is expected to operate, when used in a particular application of the power amplifier (e.g., user of the power amplifier in an radio frequency unit [RFU] transmitter). Examples of operational parameters can include, without limitation, a frequency, phase, or power level of an input signal received by the power amplifier for amplification to an output signal. Other examples of operational parameters can include a power level of the output of the power amplifier (e.g., power level of output signal), a temperature of the power amplifier (e.g., as a whole or of particular components) and a temperature around the power amplifier (e.g., ambient temperature). Examples of operational parameters can also include whether the power amplifier is operating in a quiescent mode (i.e., the power amplifier is drawing quiescent drain current) or non-quiescent mode (i.e., the power amplifier is drawing non-quiescent drain current).

For instance, during calibration of a power amplifier, optimization of a quiescent drain current ($I_{dq}$) of the power amplifier may occur for the permutations of the following operational parameters of the power amplifier: a set of frequencies $F=\{f_1, f_2, f_3, \ldots f_p\}$ expected for the input signals; and a set of power amplifier temperatures $T=\{t_1, t_2, t_3, \ldots t_m\}$ expected during operation of the power amplifier. During calibration, temperatures of the power amplifier may be controlled through a testing or calibration chamber (e.g., which may be used during the power amplifier's time of manufacture). The quiescent drain current ($I_{dq}$) values determined during the calibration phase may be regarded as a set of optimized quiescent drain current ($I_d$) values for the power amplifier while operating under the operational parameters.

Determining one or more quiescent drain current ($I_{dq}$) values for the power amplifier operating under the operational parameters may comprise adjusting the quiescent drain current ($I_{dq}$) of the power amplifier, while the power amplifier is operating under the operational parameters, such that the quiescent drain current ($I_{dq}$) meets satisfies one or more requirements of the power amplifier's intended application. As noted herein, the quiescent drain current ($I_{dq}$) of the power amplifier can be adjusted by controlling the bias of the power amplifier. When the quiescent drain current ($I_{dq}$) satisfies the requirements of the power amplifier's intended application, the bias value used to reach the quiescent drain current ($I_{dq}$) may be recorded. For some embodiments, a spectrum analyzer is utilized to determine whether a given quiescent drain current ($I_{dq}$) satisfies a requirement of the power amplifier's intended application.

The one or more quiescent drain current ($I_{dq}$) values determined for the power amplifier may be stored (e.g., as calibrated drain current data) in a datastore (e.g., flash memory, possibly in some type of database) for future data retrieval and use during the operation phase of the power amplifier. The quiescent drain current ($I_{dq}$) values may be stored according to their one or more corresponding operational parameters, thereby permitting future retrieval based on those operational parameters.

During the calibration phase, a non-quiescent drain current ($I_{dnq}$) of the power amplifier may be calibrated over a set of power levels for the output signal of the power amplifier, thereby resulting in a set of calibrated drain current ($I_d$) values for the power amplifier. Calibrating the non-quiescent drain current ($I_{dnq}$) of the power amplifier over a set of power levels may comprise determining a set of non-quiescent drain current ($I_{dnq}$) values for the power amplifier for the set of power levels and one or more additional operational parameters under which the power amplifier may be operated, or is expected to operate, when used in a particular application of the power amplifier (e.g., user of the power amplifier in RFU transmitter).

For example, calibration of a power amplifier may comprise determining one or more non-quiescent drain current ($I_d$) values for the power amplifier for permutations of the following operational parameters of the power amplifier: a set of power levels $P=\{p_1, p_2, p_3, \ldots p_n\}$ of an output signal of the power amplifier; a set of frequencies $F=\{f_1, f_2, f_3, \ldots f_p\}$ expected for the input signals; and a set of temperatures for the power amplifier $T=\{t_1, t_2, t_3, \ldots t_m\}$ expected during operation of the power amplifier. The non-quiescent drain current ($I_{dnq}$) values determined during the calibration phase may be regarded as a set of calibrated drain current ($I_d$) values for the power amplifier while operating under the operational parameters.

The non-quiescent drain current ($I_{dnq}$) values determined for the power amplifier may be stored (e.g., as calibrated drain current data) in a datastore (e.g., flash memory, possibly in some type of database) for future data retrieval and use during the operation phase of the power amplifier. The non-quiescent drain current ($I_{dnq}$) values may be stored according to their one or more corresponding operational parameters, including the set of power levels. By doing so, the non-quiescent drain current ($I_{dnq}$) values can be subsequently retrieved based on those operational parameters.

For some embodiments, during the calibration phase, a power amplifier is not being utilized for its intended application. For example, where the power amplifier is being used in a radio frequency unit (RFU), the power amplifier may not be in use by the RFU during a calibration process.

During the operation phase, the unit (e.g., RFU) in which the power amplifier is installed may be powered up, a processor (e.g., microcontroller of the unit) may determine (e.g., measure) a present value of the drain current of the power amplifier, and the processor may compare the present drain current value to a saved drain current value (e.g., an optimized quiescent drain current value or a calibrated drain current value) determined during the calibration phase. For some embodiments, the saved drain current value is obtained from the calibrated drain current data stored during the calibration phase. Additionally, for some embodiments, the saved drain current value to which the present drain current value is compared is a saved drain current value that associated with one or more present operational parameters under which the power amplifier is presently operating while the unit is operating (e.g., powered up).

Based on whether the difference between the present drain current value and the saved drain current value satisfies a particular condition, the processor may maintain the drain current at its present drain current value or control (e.g., adjust) the drain current to match or sufficiently match the saved drain current value. The particular condition, for example, (e.g., difference is equal to, more than, less than, more than or equal to, or less than or equal to a predetermined value. The difference may be regarded as the error of the present drain current value in view of the saved drain current value, and the predetermined value may be regarded as an error limit. The particular condition may be determined based on, and vary according to, the intended application of the power amplifier. The particular condition may, for example, correspond to one or more operational constraints (e.g., drain current tolerances) for the power amplifier while it operates in its intended application. In this way, while the power amplifier is operating under a given set of operational parameters, the processor can control the drain current of the power amplifier, based on the drain current values obtained during the calibration phase, such that the power amplifier operates at or at or near optimal levels for the given set of operational parameters.

In one example, after the unit including the power amplifier is turned on, the processor may, at time t, check the present drain current value for the drain current of the power amplifier and determine the following operational parameters under which the power amplifier is presently operating associated with the present drain current value: the present power level $p_t$ for an output signal of the power amplifier; a frequency $f_t$ of an input signal of the power amplifier; and a power amplifier temperature $t_t$. The present drain current value at time t associated with the present operational parameter at time t can be represented herein as $I_{dt}(p_t, f_t, t_t)$. Based on the present operational parameters of $p_t$, $f_t$, and $t_t$ at time t, the processor can obtain (e.g., calibrated drain current data) a saved drain current value associated with the present operational parameters of $p_t$, $f_t$, and $t_t$ at time t. The saved current drain current value at time t associated with the present operational parameter at time t can be represented herein as $I_{ds}(p_t, f_t, t_t)$. The processor may calculate the absolute difference between $I_{dt}(p_t, f_t, t_t)$ between $I_{ds}(p_t, f_t, t_t)$ and determine whether the calculated difference is less than or equal to an error limit $\epsilon$, as follows:

$$|I_{dt}(p_t, f_t, t_t) - I_{ds}(p_t, f_t, t_t)| \leq \epsilon.$$

If the calculated difference is less than or equal to an error limit $\epsilon$, the processor may maintain (e.g., keep) the drain current at the present drain current value $I_{dt}(p_t, f_t, t_t)$. If otherwise, the process may adjust the drain current to match the saved current drain current $I_{ds}(p_t, f_t, t_t)$. For some embodiments, adjusting the drain current to match the saved current drain current $I_{ds}(p_t, f_t, t_t)$ is performed after adaptively controlling power of the power amplifier according to a desired output power level, e.g., using a proportional-integral-derivative (PID) process. For some embodiments, the PID process is configured to be performed at a predetermined rate (e.g., a PID loop is performed every 10 Tsecs), and may be performed via a variable-voltage attenuator (VVA) that provides an input signal to the power amplifier.

During the operation phase, the processor may continually or periodically (e.g., based on a time delay, such as 10 minutes) determine a present value of the drain current of the power amplifier and compare the present drain current value to a saved drain current value. Based on the result of the comparison (e.g., difference is more than a predetermined error limit), the drain current of the power amplifier may be adjusted or maintained. By doing so, the processor can continually or periodically adapt the drain current according to one or more of the latest operational parameters under which the power amplifier is operating.

For some embodiments, systems and methods described herein eliminate the need for a "burn-in" procedure for a GaN device or reduce the burn-in time for the GaN device. Systems and methods described herein may maintain long term performance for a GaN device, may improve GaN device reliability and mean time between failures (MTBF), and may achieve optimum operating conditions for a GaN device in different applications. For example, with respect to a GaN power amplifier, various systems and methods described herein may stabilize the GaN power amplifier's performance, maximize its performance for different applications, reduce its production time, or lower its manufacturing cost.

Figure 2:
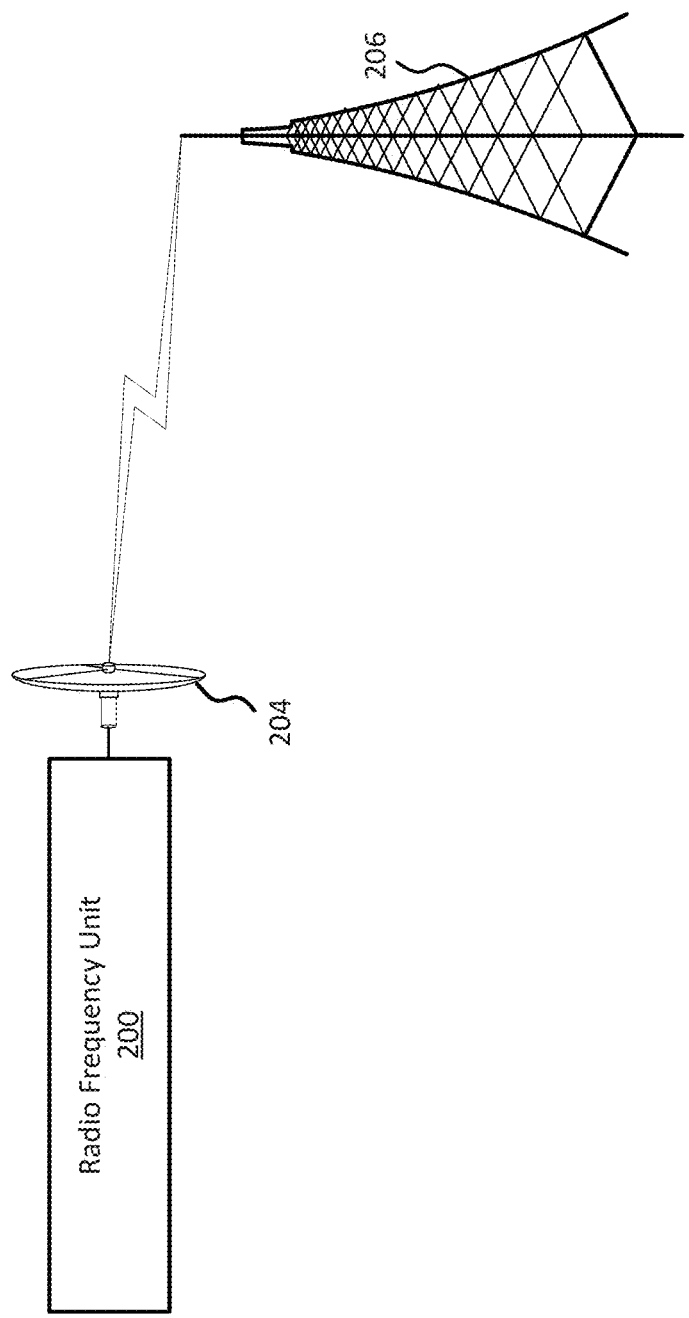
FIG. 2 depicts an example radio frequency unit (RFU) that can utilize a power amplifier in accordance with some embodiments.

FIG. 2 depicts an example radio frequency unit (RFU) 200 that can utilize a GaN power amplifier in accordance with some embodiments. In FIG. 2, the RFU 200 provides a wireless signal to a wireless communication tower 206 (e.g., cell tower or other microwave radio device) via an antenna 204. To provide the wireless signal, the RFU 200 may comprise a GaN power amplifier in accordance with embodiments described herein. Gallium Nitride (GaN) is a wide-band gap semiconductor material that may be operated at a high drain voltage (e.g., in the range of 20 V to 60 V) and may also offer a higher output power capability (e.g., in the range of 4-8 W/mm). As a result, GaN power amplifiers may be easier to match over a wider bandwidth, have better reliability, and improved ruggedness compared to GaAs devices. In addition, the use of a linearization circuitry can allow the operation of the final stage power amplifier in a class AB or Class B mode thus affording much higher power added efficiency (PAE).

Figure 3:
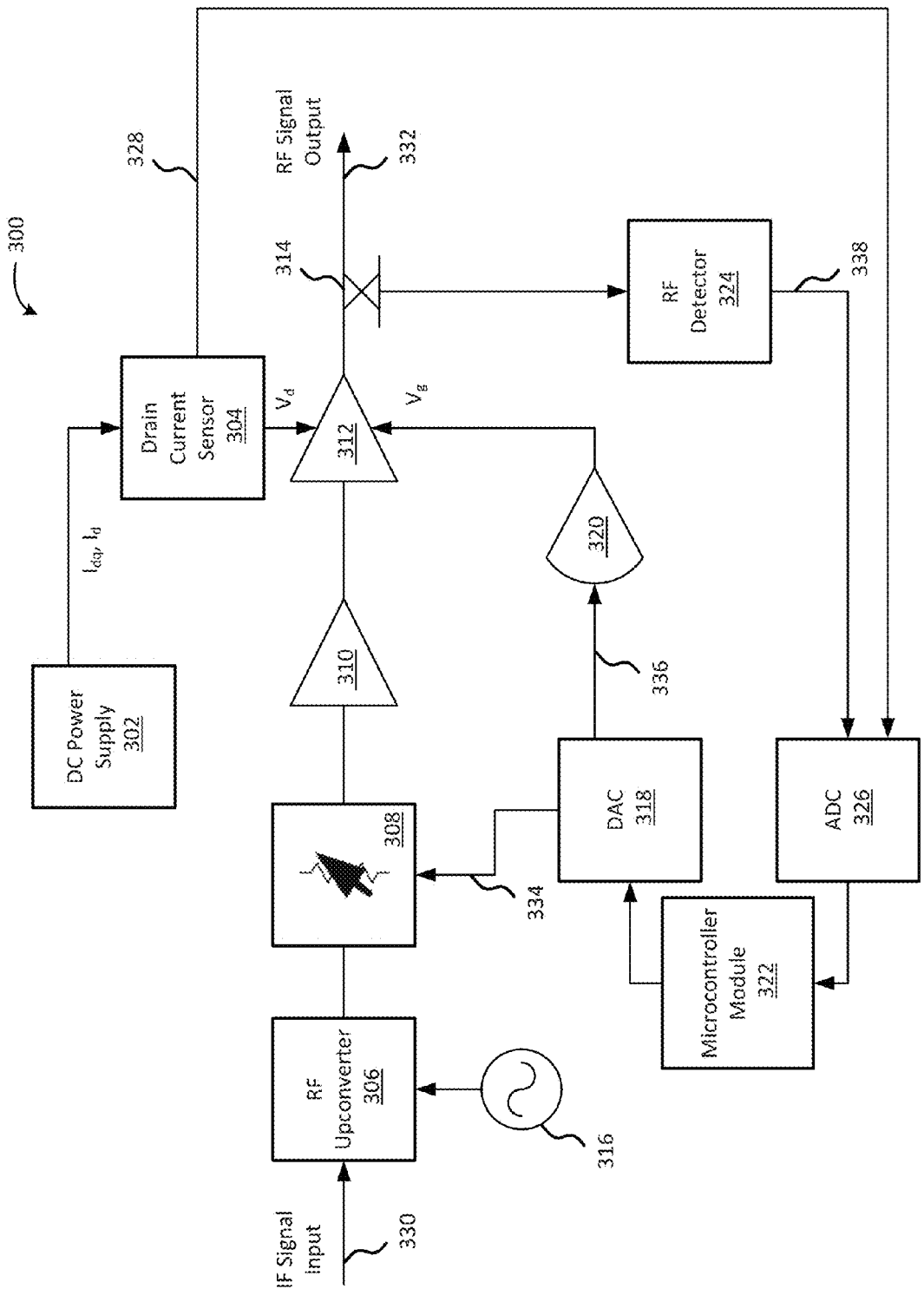
FIG. 3 is a diagram of an example transmitter utilizing a power amplifier in accordance with some embodiments.

FIG. 3 is a diagram of an example transmitter 300 utilizing a power amplifier in accordance with some embodiments. In FIG. 3, the transmitter 300 comprises a direct current (DC) power supply 302, a drain current sensor 304, a radio frequency (RF) upconverter 306, a variable voltage attenuator (VVA) 308, a gain block 310, a power amplifier 312, a coupler 314, a local oscillator 316, a digital-to-analog converter (DAC) 318, a voltage converter 320, a microcontroller module 322, a radio frequency (RF) detector 324, and an analogto-digital converter (ADC) 326. As shown, the DC power supply 302 is coupled to the drain current sensor 304, the drain current sensor 304 is coupled to the power amplifier 312 and the ADC 326, the local oscillator 316 is coupled to the RF upconverter 306, the RF upconverter 306 is coupled to the VVA 308, the VVA 308 is coupled to the gain block 310, the gain block 310 is coupled to the power amplifier 312, the power amplifier 312 is coupled to the coupler 314, the coupler 314 is coupled to the RF detector 324, the RF detector 324 is coupled to the ADC 326, the ADC 326 is coupled to the microcontroller module 322, the microcontroller module 322 is coupled to the DAC 318, the DAC 318 is coupled to the VVA 308 and the voltage converter 320, and the voltage converter 320 is coupled to the power amplifier 312. Those skilled in the art will appreciate that the composition or arrangement of the transmitter 300 may vary between different embodiments. For some embodiments, one or more of the components of the transmitter 300, such as the microcontroller module 322, are implemented using a digital device, and that digital device may be similar to the one described and depicted with respect to FIG. 7. Additionally, depending on the embodiment, the transmitter 300 may be included, in whole or in part, by the radio frequency unit (RFU) 200 described and depicted herein with respect to FIG. 2.

The DC power supply 302 may be configured to provide power to various components of the transmitter 300 including, for example, the drain current sensor 304, which in turn may provide power to the power amplifier 312. By this arrangement, the DC power supply 302 can provide the power amplifier 312 with its drain voltage ($V_d$), drain current ($I_d$), and quiescent drain current ($I_{dq}$). The drain current sensor 304 may be configured to measure the drain current ($I_d$) or the quiescent drain current ($I_{dq}$) of the power amplifier 312 as the DC power supply 302 provides such current through the drain current sensor 304. The measured value of the drain current ($I_d$) or the quiescent drain current ($I_{dq}$) may be provided through a connection 328 to the ADC 326 for further processing. The measured value of the drain current ($I_d$) or the quiescent drain current ($I_{dq}$) may vary based on a number of factors including, for example, how much power is being provided by the DC power supply 302, the bias (e.g., voltage bias) being applied to the power amplifier 312 (e.g., applied to the power amplifier 312's gate), the load on the output of the power amplifier 312, and the power level of a input signal received by the power amplifier 312.

The RF upconverter 306 may be configured to receive an intermediate frequency (IF) signal via an IF signal input 330, and upconvert the IF signal to a radio frequency (RF) signal (e.g., microwave signal) using the local oscillator 316. According to some embodiments, the local oscillator 316 is a RF oscillator, and the RF upconverter 306 comprises a heterodyne system configured to upconvert the IF signal to the RF signal. The RF upconverter 306 may provide the resulting RF signal to another component of the transmitter 300, such as the VVA 308, for additional processing or transmission (e.g., over a radio link).

The VVA 308 may be configured to adjust one or more electrical properties of the RF signal provided by the RF upconverter 306 including, for example, the voltage, current, or power of the RF signal. The VVA 308 may be further configured to variably adjust the RF signal according to a control signal 334, which may be received from the microcontroller module 322 by way of the DAC 318.

For some embodiments, the VVA 308 is utilized to set or otherwise adjust the power level of the power amplifier 312 and may do so by adjusting the power of the input signal (e.g., the RF signal) that the VVA 308 provides to the power amplifier 312 through the gain block 310. As described herein, the VVA 308 may be utilized to set or otherwise adjust the power level of the power amplifier 312 when the power amplifier 312 is determined to be operating in a low-power mode (e.g., $P_{out}<P_{sens}$) or a high-power mode (e.g., $P_{out}\geq P_{sens}$). For instance, when the power amplifier 312 is operating in a high-power mode, the VVA 308 may set or adjust the power level of the power amplifier 312 to be less than a sensitivity power level and, in doing so, sets the power amplifier 312 to operate in a low-power mode. As described herein, after the power amplifier 312 is set from operating in a high-power mode to operating in a low-power mode, and an adaptive closed-loop control is utilized to adjust the drain current of the power amplifier 312, the VVA 308 may be used to set or adjust the power level of the power amplifier 312 to reach a desired power level for the RF signal output 332. As also described herein, the VVA 308 may be utilized in setting the power level of the power amplifier 312 during adaptive power control of the power amplifier 312, which may utilize a proportional-integral-derivative (PID) process.

The gain block 310 may be any form of amplifier suitable for receiving an IF or RF signal and providing a gain to the IF or RF signal. The gain block 310 may be configured to receive the variably attenuated RF signal from the VVA 308, apply a gain (e.g., a predetermined gain), and provide the resulting RF signal to the power amplifier 312.

The power amplifier 312 may be a GaN power amplifier, and may be configured to receive an input signal (e.g., via a signal input port), amplify the input signal to an output signal, and provide the output signal (e.g., via a signal output port). The power amplifier 312 may receive and be powered by a drain current provided by a power source, such as the DC power supply 302. Amplification of the input signal to an output signal by the power amplifier 312 may be based on (e.g., controlled by) a bias being applied to the power amplifier 312 (e.g., applied to the power amplifier 312's gate) as a control input. As shown in FIG. 3, the bias may be a voltage bias $V_g$ being provided by the voltage converter 320. The voltage converter 320 may be configured to generate and provide voltage bias $V_g$ according to a control signal 336 received from the microcontroller module 322 as converted by the DAC 318. Once the RF signal received by the power amplifier 312 is amplified, the resulting amplified RF signal may be provided for transmission via an RF signal output 332.

The coupler 314 may be configured to sample or split a signal (e.g., an amplified RF signal) being output from the power amplifier 312. In some embodiments, the coupler 314 samples the output signal from the power amplifier 312 and provides the sampled signal to the RF detector 324 for feedback processing. Upon receiving the sampled signal, the RF detector 324 may be configured to detect the presence of the signal or determine one or more characteristics of the sampled signal including, for instance, the frequency, phase, power level (e.g., amplitude) of the received sampled signal. The RF detector 324 may inform another component of the sample signal's presence or characteristics via line 338. For instance, the RF detector 324 may inform the microcontroller module 322 of the sample signal's presence or characteristics through ADC 326 and via the line 338.

The microcontroller module 322 may be configured to control one or more components of the transmitter 300 via one or more control signal outputs. Additionally, the microcontroller module 322 may be configured to control one or more components of the transmitter 300 according to input signals received from one or components of the transmitter 300. The microcontroller module 322 may include a processor to facilitate its operation. As described herein, the microcontroller module 322 may be implemented, in whole or in part, using a digital device. Analog signals to the microcontroller module 322 (e.g., from the drain current sensor 304 and the RF detector 324) may converted to a digital signal by the ADC 326 before they are received by the microcontroller module 322, and digital signals from the microcontroller module 322 (e.g., for the VVA 308 and for the voltage converter 320) may be converted to analog signals by the DAC 318. For some embodiments, one or more of the methods described herein are performed, in whole or in part, by the microcontroller module 322. The processor included by the microcontroller module 322 may facilitate the performance of steps or operations described herein as described herein.

For some embodiments, the microcontroller module 322 controls the VVA 308 via the control signal 334 provided by the DAC 318, and the VVA 308 in turn controls the input signal provided to the power amplifier 312 via the gain block 310. As described herein, the VVA 308 may control the power level of the power amplifier 312 (e.g., of the output signal of the power amplifier 312) by controlling the input signal provided to the power amplifier 312 by the VVA 308. In some embodiments, the microcontroller module 322 adaptively controls power of the power amplifier 312, via the VVA 308, using a proportional-integral-derivative (PID) process. For instance, the microcontroller module 322 compares the actual output power of the power amplifier 312 as measured by the RF detector 324, with a desired or expected output power for the power amplifier 312, and uses a PID algorithm to adaptively control the VVA 308 to adjust the power level of the power amplifier 312 to achieve the desired or expected output power of the power amplifier 312.

In some embodiments, when applying a closed-loop control to the drain current of the power amplifier 312, the microcontroller module 322 adaptively controls the power of the power amplifier 312 and then sets the drain current of the power amplifier 312 according to a target drain current value associated with the present operational parameter (e.g., temperature or frequency) and power level as measured by the RF detector 324. As described herein, the target drain current value may be one determined, and stored as calibrated drain current data, during a calibration process as described herein. For some embodiments, the microcontroller module 322 adaptively controls the power of the power amplifier 312 and then sets the drain current of the power amplifier 312 according to a target drain current value (e.g., from the calibrated drain current data) when the power amplifier 312 is operating in a low-power mode (e.g., power level of the output signal of the power amplifier 312 is lower than the sensitivity power level).

In various embodiments, the microcontroller module 322 controls the drain current of the power amplifier 312 by controlling a bias to the power amplifier 312's gate voltage ($V_g$). In FIG. 3, the bias to the power amplifier 312's gate voltage through the control signal 336 to the voltage converter 320.

Figure 4:
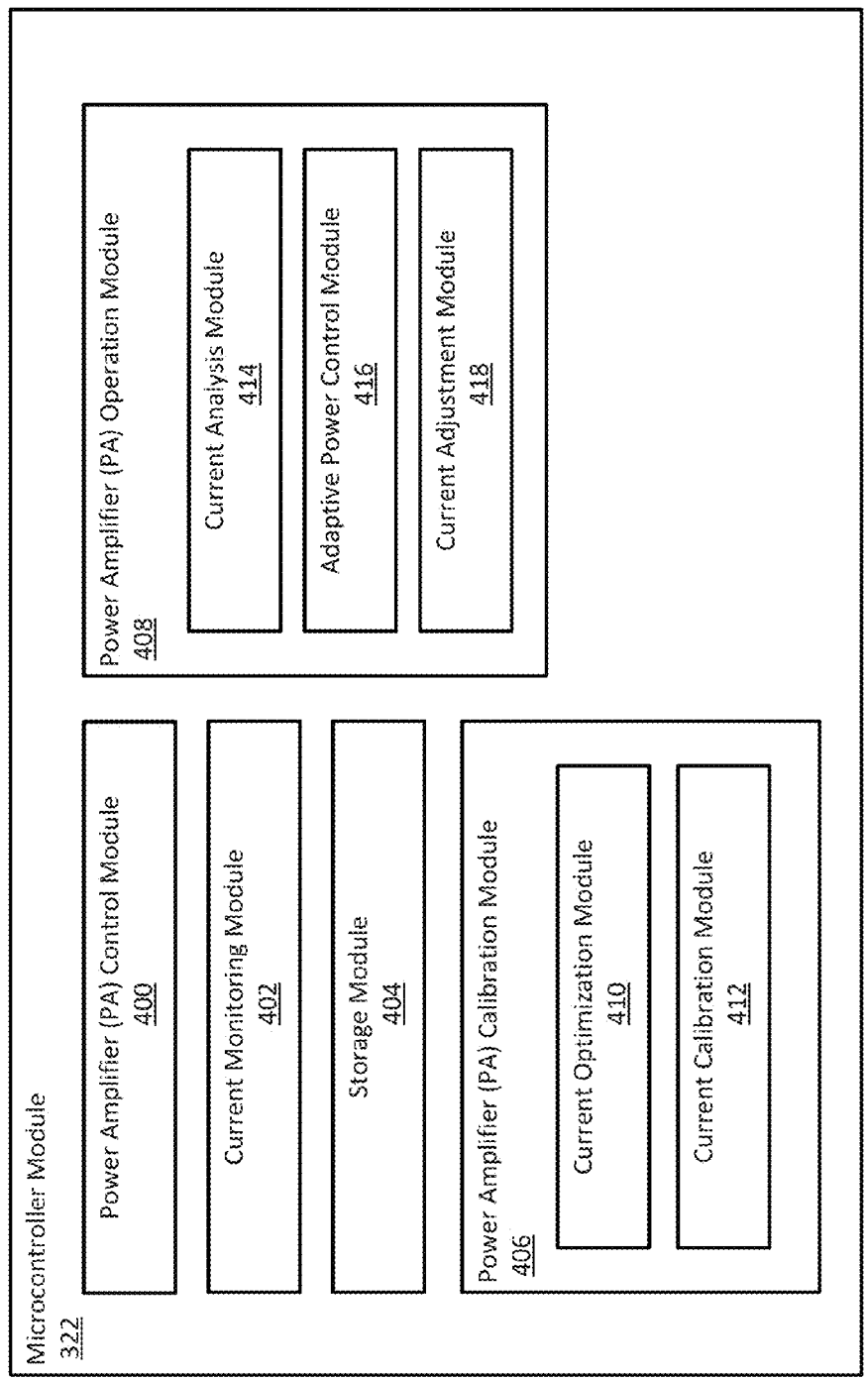
FIG. 4 is a block diagram of an example microcontroller module that can be utilized with a power amplifier in accordance with some embodiments.

FIG. 4 is a block diagram of the microcontroller module 322 that can be utilized with a power amplifier in accordance with some embodiments. In FIG. 4, the microcontroller module 322 comprises a power amplifier (PA) control module 400, a current monitoring module 402, a storage module 404, a power amplifier (PA) calibration module 406, and a power amplifier (PA) operation module 408. The PA calibration module 406 comprises a current optimization module 410 and a current calibration module 412. The PA operation module 408 comprises a current analysis module 414, an adaptive power control module 416, and a current adjustment module 418. Those skilled in the art will appreciate that the composition or arrangement of microcontroller module 322 may vary between different embodiments. As described herein, one or more of the methods described herein may be performed, in whole or in part, by the microcontroller module 322. As also described herein, the microcontroller module 322 may be implemented, in whole or in part, using a digital device, and that digital device may be similar to the one described and depicted with respect to FIG. 7.

The PA control module 400 may be configured to facilitate control of the power amplifier 312, and may do so by controlling drain current of the power amplifier 312. For some embodiments, the PA control module 400 controls the drain current of the power amplifier 312 by controlling the voltage bias $V_g$ provided to the power amplifier 312. In some embodiments, the voltage converter 320 provides the voltage bias $V_g$ to the power amplifier 312, and the PA control module 400 controls the voltage converter 320 via control signals through the DAC 318.

The current monitoring module 402 may be configured to facilitate measurement of the drain current of the power amplifier 312, and may do so by through the drain current sensor 304. According to some embodiments, the drain current sensor 304 measures the drain current provided by the DC power supply 302 to the power amplifier 312, and provides the measured value to the current monitoring module 402 as a signal. The signal provided by the drain current sensor 304 may be analog and require conversion through the ADC 326 before being received by the current monitoring module 402.

The storage module 404 may be configured to facilitate storage and retrieval of various data as various components of the microcontroller module 322 perform operations. In some embodiments, the storage module 404 stores and subsequently retrieves drain current values used by the PA calibration module 406 or the PA operation module 408 during a calibration or operation phase of the power amplifier 312. The storage module 404 may utilize or include some form of memory (e.g., flash memory) or datastore to facilitate storage and retrieval of data for operations of the microcontroller module 322. In certain embodiments, the storage module 404 stores a set of drain current values, in association with operational parameters, and calibrated with a set of power levels of the power amplifier 312. The storage module 404 may store the set of drain current values to, and subsequently retrieve drain current values from, a calibration file.

The PA calibration module 406 may be configured to facilitate calibration phase operations, as described herein, with respect to the power amplifier 312. For example, during calibration of the power amplifier 312, the current optimization module 410 may be configured to determine one or more quiescent drain current ($I_{dq}$) values for the power amplifier 312 for one or more operational parameters under which the power amplifier 312 may be operated, or is expected to operate, when used for signal transmission in the transmitter 300. The operational parameters for the power amplifier 312 may, for example, comprise permutations of the following operational parameters: a set of frequencies $F=\{f_1, f_2, f_3, \ldots f_p\}$ expected for the input signals during operation of the power amplifier 312; and a set of power amplifier temperatures $T=\{t_1, t_2, t_3, \ldots t_n\}$ expected during operation of the power amplifier 312. Determining one or more quiescent drain current ($I_{dq}$) values for the power amplifier 312 operating under the operational parameters may comprise adjusting the quiescent drain current ($I_{dq}$) of the power amplifier 312, via the voltage bias $V_g$ applied by the voltage converter 320, while the power amplifier 312 is operating under the operational parameters. The quiescent drain current ($I_{dq}$) values determined during by the current optimization module 410 may be regarded as a set of optimized quiescent drain current ($I_d$) values for the power amplifier 312 while operating under the operational parameters. Additionally, the one or more quiescent drain current ($I_{dq}$) values determined by the current optimization module 410 for the power amplifier 312 may be stored as calibrated drain current data by the storage module 404, and may be done so according to their one or more corresponding operational parameters, output power levels, or both (e.g. to permit future retrieval based on those operational parameters, output power levels, or both).

The current calibration module 412 may be configured to determine a set of non-quiescent drain current ($I_{dnq}$) values for the power amplifier 312 for a set of power levels $P=\{p_1, p_2, p_3, \ldots p_n\}$ and additional operational parameters under which the power amplifier 312 may be operated, or is expected to operate when used for signal transmission in the transmitter 300. The additional operational parameters may comprise permutations of the following operational parameters: a set of frequencies $F=\{f_1, f_2, f_3, \ldots f_p\}$ expected for the input signals during operation of the power amplifier 312; and a set of power amplifier temperatures $T=\{t_1, t_2, t_3, \ldots t_m\}$ expected during operation of the power amplifier 312. The non-quiescent drain current ($I_{dnq}$) values determined by the current calibration module 412 may be regarded as a set of calibrated drain current ($I_d$) values for the power amplifier 312 while operating under the operational parameters. Additionally, the non-quiescent drain current ($I_{dnq}$) values determined by the current calibration module 412 for the power amplifier 312 may be stored as calibrated drain current data by the storage module 404, and may be done so according to their one or more corresponding operational parameters (e.g. to permit future retrieval based on those operational parameters).

The PA operation module 408 may be configured to facilitate operation phase operations, as described herein, with respect to the power amplifier 312. For instance, during the operation phase of the power amplifier 312 (e.g., when the power amplifier 312 is being used in the transmitter 300 to transmits signals), the current analysis module 414 may be configured to receive a present value of the drain current of the power amplifier 312 as measured by the drain current sensor 304, and compare the present drain current value to a saved drain current value (e.g., an optimized quiescent drain current value or a calibrated drain current value) determined during the calibration phase and saved through the storage module 404. Through the storage module 404, the current analysis module 414 may obtain the saved drain current value from the calibrated drain current data. As described herein, for some embodiments, the saved drain current value to which the present drain current value is compared is a saved drain current value that associated with one or more present operational parameters under which the power amplifier 312 is presently operating while the transmitter 300 is operating.

Based on whether the difference between the present drain current value and the saved drain current value satisfies a particular condition, the current analysis module 414 may maintain the drain current at its present drain current value or control (e.g., adjust) the drain current to match or sufficiently match the saved drain current value.

The adaptive power control module 416 may be configured to adaptively control the power of the power amplifier 312. According to some embodiments, the adaptive power control module 416 controls the VVA 308 via the control signal 334 provided by the DAC 318, and the VVA 308 in turn controls the input signal provided to the power amplifier 312 via the gain block 310. As described herein, the VVA 308 may control the power level of the power amplifier 312 (e.g., of the output signal of the power amplifier 312) by controlling the input signal provided to the power amplifier 312. The adaptive power control module 416 may adaptively control power of the power amplifier 312, via the VVA 308, using a proportional-integral-derivative (PID) process. The adaptive power control module 416 may compare the actual output power of the power amplifier 312 as measured by the RF detector 324, with a desired or expected output power of the power amplifier 312, and use a PID algorithm to adaptively control the VVA 308 to adjust the power level of the power amplifier 312 to achieve the desired or expected output power of the power amplifier 312.

The current adjustment module 418 may be configured to control the drain current (e.g., while applying a closed-loop control to the drain current) when the drain current needs to be controlled to match or sufficiently match the present drain current value to the saved drain current value. According to some embodiments, the current adjustment module 418 controls the drain current to the saved drain current value by controlling the voltage bias $V_g$ applied by the voltage converter 320 to the power amplifier 312's gate and measuring the present drain current value (as provided by the drain current sensor 304) until the present drain current value matches or substantially matches the saved drain current value.

Those skilled in the art will appreciate that the components of FIG. 3 described above with respect to the components of FIG. 4 are merely examples of components that may be used with the microcontroller module 322, and that other components may also be utilized in some embodiments.

Figure 5:
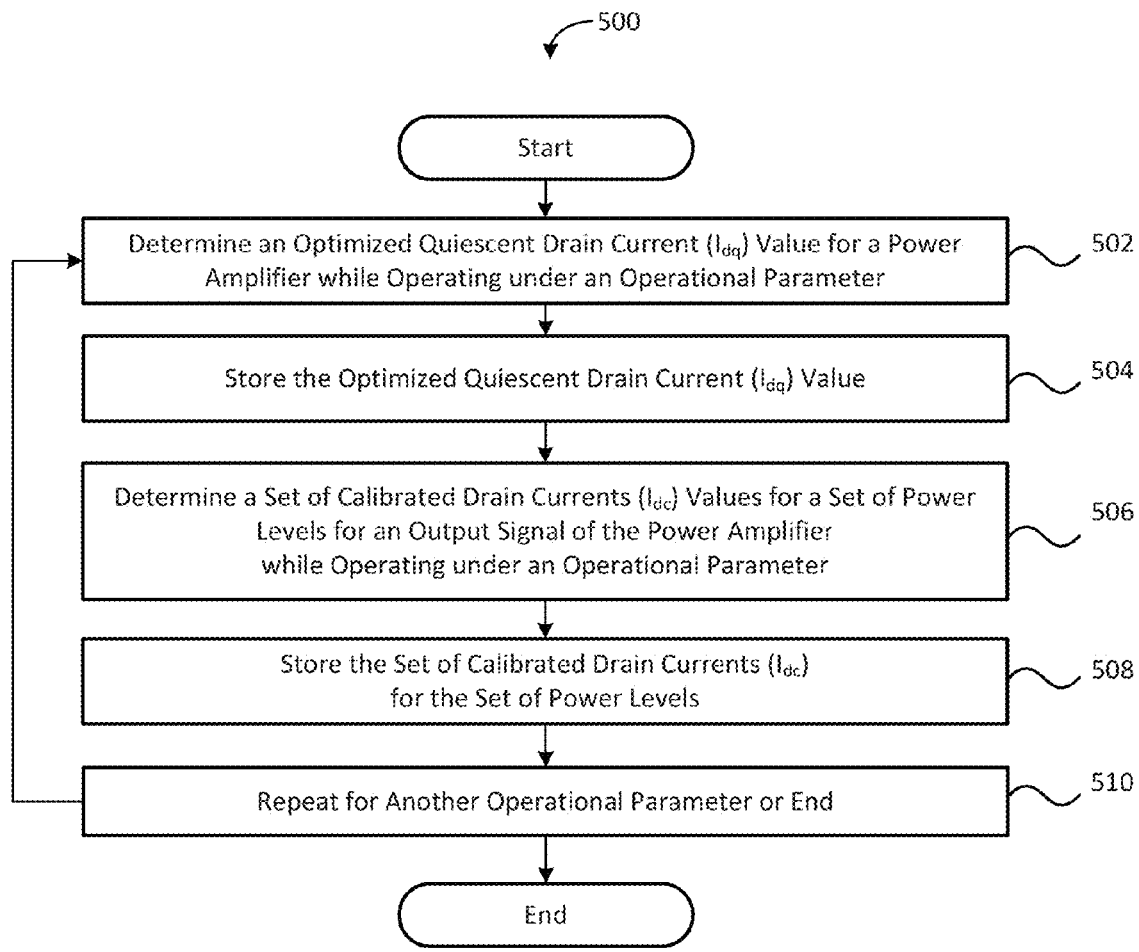
FIG. 5 is a flow diagram of an example method for calibrating a power amplifier in accordance with some embodiments.

FIG. 5 is a flow diagram of an example method 500 for calibrating a power amplifier in accordance with some embodiments. The method 500 begins at step 502 with the current optimization module 410 determining an optimized quiescent drain current ($I_{dq}$) value for the power amplifier 312 while the power amplifier 312 is operation under an operational parameter. At step 504, the storage module 404 stores the optimized quiescent drain current ($I_{dq}$) value, and may store it as calibrated drain current data. At step 506, the current calibration module 412 determines a set of calibrated drain current ($I_{dq}$) values for a set of power levels for an output signal of the power amplifier 312 while the power amplifier 312 is operating under the operational parameter. At step 508, the storage module 404 stores the set of calibrated drain current ($I_{ds}$) values, and may store it as calibrated drain current data. At step 510, can either return to step 502 and repeat the method 500 for another operational parameter or end the method 500. In some embodiments, the calibrated drain current data is stored in a calibration file that can be utilized during operation of the power amplifier 312. As described herein, based on a target drain current value provided by the calibration file (e.g., for a given operational parameter and power level of the power amplifier 312), the gate voltage of the power amplifier 312 can be biased to achieve the target drain current value.

Though the steps of the method 500 may be depicted and described in a certain order, those skilled in the art will appreciate that the order in which the steps are performed may vary between different embodiments. Additionally, those skilled in the art will appreciate that the components described above with respect to the method 500 are merely examples of components that may be used with the method 500, and that other components may also be utilized in some embodiments.

Figure 6:
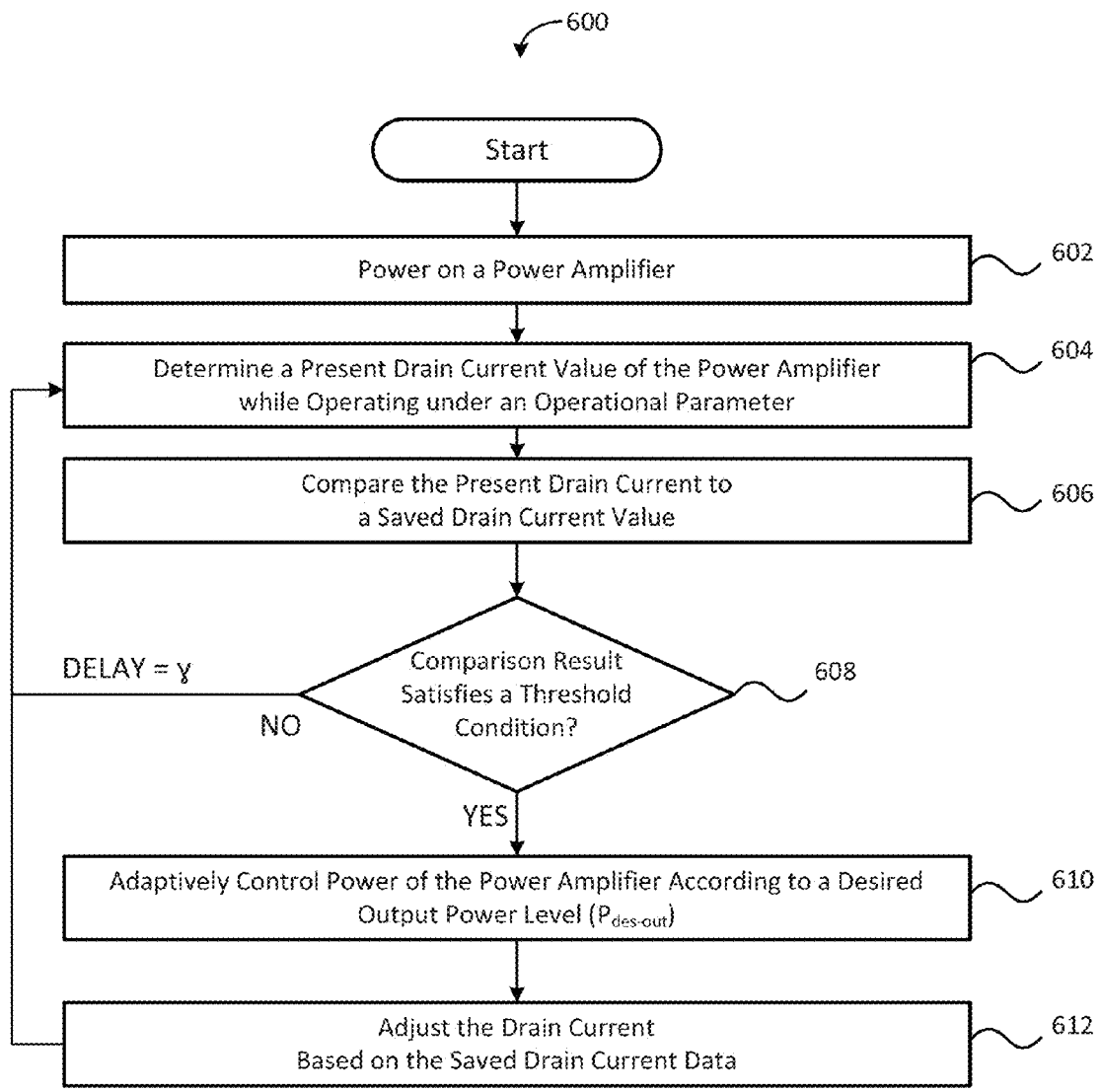
FIG. 6 is a flow diagram of an example method for operating a power amplifier in accordance with some embodiments.

FIG. 6 is a flow diagram of an example method 600 for operating a power amplifier in accordance with some embodiments. The method 600 begins at step 602 the PA control module 400 powers on the power amplifier 312 (e.g., from a power-off state). At step 604, the current monitoring module 402 determines (e.g., measures) a present drain current value of the power amplifier 312 while the power amplifier 312 is operating under an operational parameter. At step 606, the current analysis module 414 compares the determined drain current value to a saved drain current value (e.g., from the calibrated drain current data), which may have been generated during the method 500. For some embodiments, for step 606, the current analysis module 414 compares the determined drain current value to a saved drain current value by calculating the difference between the determined drain current value and the saved drain current value. Once calculated, the current analysis module 414 can compare the difference against an error threshold at step 608. In this way, the error threshold can define when the present drain current value for the power amplifier 312 is considered less than desirable or optimal during operation of the power amplifier 312. Depending on the embodiment, the error threshold may be determined during a calibration process or at the time of a transmitter or transceiver's manufacture.

If at step 608, the current analysis module 414 determines that the result of comparing the determined drain current value to the saved drain current value satisfies a threshold condition, the method 600 continues to step 610. If during step 608 the current analysis module 414 determines that the result comparing the determined drain current value to the saved drain current value does not satisfy the threshold condition, the method 600 returns to step 604 and the method 600 repeats itself from step 604. According to some embodiments, the method 600 returns to step 604 after a predetermined time delay (e.g., 10 minutes).

At step 610, the adaptive power control module 416 adaptively controls the power of the amplifier 312 according to a desired power level ($P_{des-out}$), and may do so by controlling the VVA 308 providing the input signal to the power amplifier 312 (via the gain block 310). As described herein, the adaptive power control module 416 may adaptively control the power of the amplifier 312 using a proportional-integral-derivative (PID) process, which may loop at a predetermined interval (e.g., 10 Tsecs). The desired power level ($P_{des-out}$) may serve as the set point in the PID process.

Subsequently, at step 612, the current adjustment module 418 adjusts the drain current of the power amplifier 312 based on the saved drain current value associated with the present operational parameter (e.g., frequency and temperature) and power level of the power amplifier 312 after step 610. For some embodiments, the current adjustment module 418 determines the power level of the power amplifier 312 after step 610 using the power level measurement provided by the RF detector 324.

Though the steps of the method 600 may be depicted and described in a certain order, those skilled in the art will appreciate that the order in which the steps are performed may vary between different embodiments. Additionally, those skilled in the art will appreciate that the components described above with respect to the method 600 are merely examples of components that may be used with the method 600, and that other components may also be utilized in some embodiments.

Figure 7:
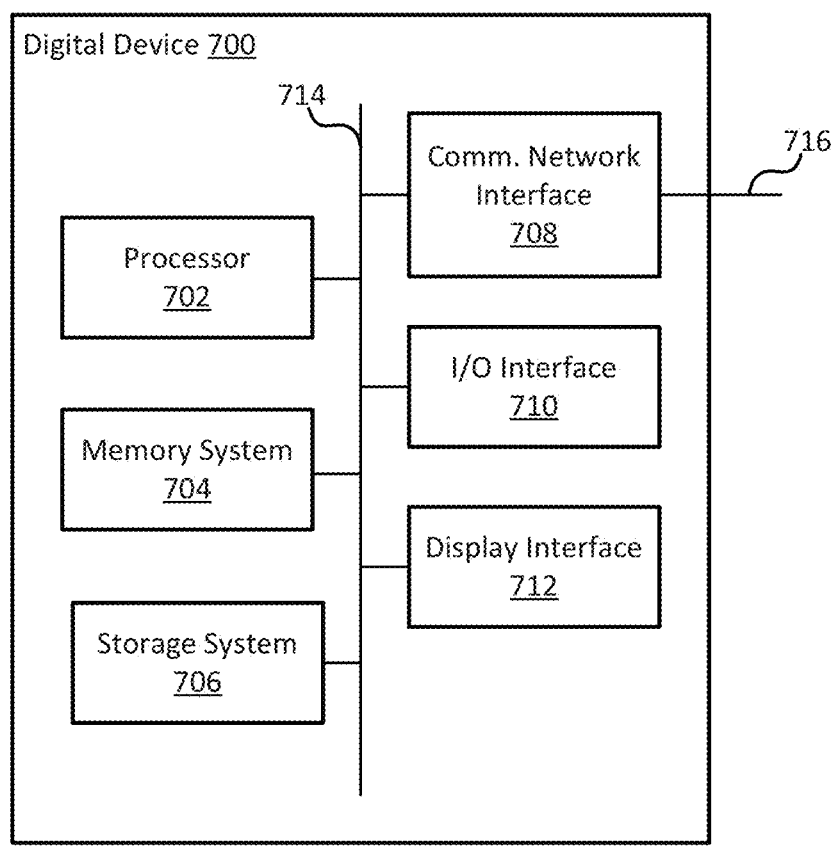
FIG. 7 depicts an example digital device according to some embodiments.

FIG. 7 depicts an example digital device 700 according to some embodiments. The digital device 700 comprises a processor 702, a memory system 704, a storage system 706, a communication network interface 708, an I/O interface 710, and a display interface 712 communicatively coupled to a bus 714. The processor 702 may be configured to execute executable instructions (e.g., programs). In some embodiments, the processor 702 comprises circuitry or any processor capable of processing the executable instructions.

The memory system 704 is any memory configured to store data. Some examples of the memory system 704 are storage devices, such as RAM or ROM. The memory system 704 may comprise the RAM cache. In various embodiments, data is stored within the memory system 704. The data within the memory system 704 may be cleared or ultimately transferred to the storage system 706.

The storage system 706 is any storage configured to retrieve and store data. Some examples of the storage system 706 are flash drives, hard drives, optical drives, or magnetic tape. In some embodiments, the digital device 700 includes a memory system 704 in the form of RAM and a storage system 706 in the form of flash data. Both the memory system 704 and the storage system 706 comprise computer readable media that may store instructions or programs that are executable by a computer processor including the processor 702.

The communication network interface (com. network interface) 708 may be coupled to a data network via the link 716. The communication network interface 708 may support communication over an Ethernet connection, a serial connection, a parallel connection, or an ATA connection, for example. The communication network interface 708 may also support wireless communication (e.g., 802.11 a/b/g/n, WiMAX). It will be apparent to those skilled in the art that the communication network interface 708 may support many wired and wireless standards.

The optional input/output (I/O) interface 710 is any device that receives input from the user and output data. The optional display interface 712 is any device that may be configured to output graphics and data to a display. In one example, the display interface 712 is a graphics adapter.

It will be appreciated by those skilled in the art that the hardware elements of the digital device 700 are not limited to those depicted in FIG. 7. A digital device 700 may comprise more or less hardware elements than those depicted. Further, hardware elements may share functionality and still be within various embodiments described herein. In one example, encoding or decoding may be performed by the processor 702 or a co-processor located on a GPU.

One or more functions may be stored on a storage medium such as a computer readable medium. The instructions can be retrieved and executed by a processor. Some examples of instructions are software, program code, and firmware. Some examples of storage medium are memory devices, tape, disks, integrated circuits, and servers. The instructions are operational when executed by the processor to direct the processor to operate in accord with some embodiments. Those skilled in the art are familiar with instructions, processor(s), and storage medium.

In some embodiments, an upconverting transmitter chain performs a predistortion function at an intermediate frequency (IF) and a final stage power amplifier is a gallium nitride (GaN) device, and performs adaptive control of drain current of the GaN device based on optimized quiescent drain current values or calibrated drain current values for the GaN device. The optimized quiescent drain current values or calibrated drain current values may be determined for the GaN device based on the particular application of the upconverting transmitter chain (e.g., transmitter for use in an ETSI or ANSI application). The optimized quiescent drain current values or calibrated drain current values may be determined during a calibration phase of the GaN device, when the predistortion function is disabled for the upconverting transmitter chain. During operation phase of the GaN device (e.g., when the upconverting transmitter is being used to generate an radio frequency signal for transmission), the predistortion function can be enabled (e.g., restored).

Figure 8:
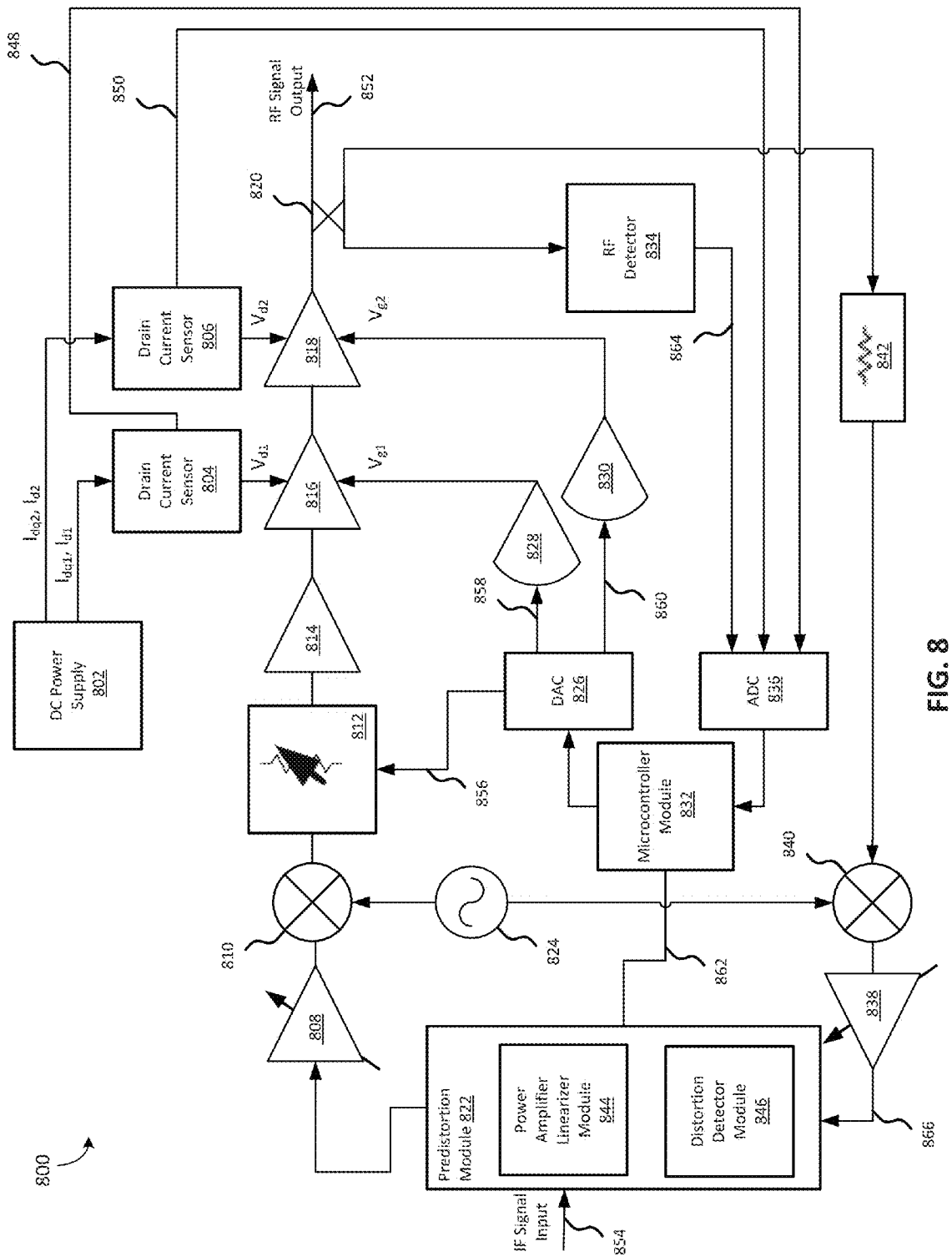
FIG. 8 is a diagram of an example transmitter utilizing a power amplifier and a predistorter module in accordance with some embodiments.

FIG. 8 is a diagram of an example transmitter 800 utilizing a power amplifier in accordance with some embodiments. In FIG. 8, the transmitter 800 comprises a direct current (DC) power supply 802, drain current sensors 804 and 806, a voltage gain amplifier (VGAs) 808 and 838, mixers 810 and 840, a variable voltage attenuator (VVA) 812, a gain block 814, power amplifiers 816 and 818, a coupler 820, a predistortion module 822, a local oscillator 824, a digital-to-analog converter (DAC) 826, voltage converters 828 and 830, a microcontroller module 832, a radio frequency (RF) detector 834, an analog-to-digital converter (ADC) 836, and a fixed voltage attenuator 842. Additionally, in FIG. 8, the predistortion module 822 comprises a power amplifier linearizer module 844 and a distortion detector module 846.

As shown, the DC power supply 802 is coupled to the drain current sensors 804 and 806, the drain current sensors 804 and 806 are respectively coupled to the power amplifiers 816 and 818, and the drain current sensors 804 and 806 are coupled to the ADC 836. The predistortion module 822 is coupled to the VGA 808, the VGA 808 is coupled to the mixer 810, the mixer 810 is coupled to the VVA 812, the VVA 812 is coupled to the gain block 814, the gain block 814 is coupled to the power amplifier 816, the power amplifier 816 is coupled to the power amplifier 818, the power amplifier 818 is coupled to the coupler 820, and the coupler 820 is coupled to the RF detector 834 and the fixed voltage attenuator 842. The RF detector 834 is coupled to the ADC 836, the ADC 836 is coupled to the microcontroller module 832, the microcontroller module 832 is coupled to the DAC 826 and the predistortion module 822, the DAC 826 is coupled to the VVA 812 and the voltage converters 828 and 830, the voltage converter 828 is coupled to the power amplifier 816, the voltage converter 830 is coupled to the power amplifier 818. The fixed voltage attenuator 842 is coupled to the mixer 840, the mixer 840 is coupled to the VGA 838, and the VGA 838 is coupled to the predistortion module 822. The local oscillator 824 is coupled to mixers 810 and 840. Those skilled in the art will appreciate that the composition or arrangement of the transmitter 800 may vary between different embodiments. For some embodiments, one or more of the components of the transmitter 800, such as the microcontroller module 832, are implemented using a digital device, and that digital device may be similar to the one described and depicted with respect to FIG. 7. Additionally, depending on the embodiment, the transmitter 800 may be included, in whole or in part, by the radio frequency unit (RFU) 200 described and depicted herein with respect to FIG. 2.

The DC power supply 802 may be configured to provide power to various components of the transmitter 800 including, for example, the drain current sensors 804 and 806, which may respectively provide power to the power amplifiers 816 and 818. By this arrangement, the DC power supply 802 can provide the power amplifiers 816 and 818 with their respective drain voltages ($V_{d1}$ and $V_{d2}$), drain currents ($I_{d1}$ and $I_{d2}$), and quiescent drain currents ($I_{dq1}$ and $I_{do}$). The drain current sensor 804 may be configured to measure the drain current ($I_{d1}$) or the quiescent drain current ($I_{dq1}$) of the power amplifier 816 as the DC power supply 802 provides such current through the drain current sensor 804. Likewise, the drain current sensor 806 may be configured to measure the drain current ($I_{d2}$) or the quiescent drain current ($I_{dq2}$) of the power amplifier 818 as the DC power supply 802 provides such current through the drain current sensor 806.

The value of the drain current ($I_{d1}$) or the quiescent drain current ($I_{dq1}$), as measured by the drain current sensor 804, may be provided to the ADC 836 for further processing through a connection 848. Similarly, the value of the drain current ($I_{d2}$) or the quiescent drain current ($I_{dq2}$), as measured by the drain current sensor 806, may be provided to the ADC 836 for further processing through a connection 850. The measured value of the drain currents ($I_{d1}$ and $I_{d2}$) or the quiescent drain currents ($I_{dq1}$ and $I_{dq2}$) may vary based on a number of factors including, for example, how much power is being provided by the DC power supply 802, the bias (e.g., voltage bias) being applied to each of the power amplifiers 816 and 818 (e.g., applied to the power amplifier 816's gate, and applied to the power amplifier 818's gate), the load on the output of each of the power amplifiers 816 and 818, and the power level of a input signal received by each of the power amplifiers 816 and 818.

The predistortion module 822 may be configured to receive an input signal, such as an intermediate frequency (IF) signal, and (adaptively) generate a predistorted input signal based on the input signal. For example, as shown in FIG. 8, the predistortion module 822 receives an IF signal via an intermediate frequency (IF) signal input 854. The predistortion module 822 may be further configured to receive a feedback signal in order to generate a predistorted input signal based on the input signal, where the feedback signal is based on the predistorted input signal generated by the predistortion module 822. For example, as shown in FIG. 8, the predistortion module 822 receives a feedback signal 866, which is based on a radio frequency (RF) signal generated by the transmitter 800 and output via the RF signal output 852.

As show in the FIG. 8, the predistortion module 822 comprises the power amplifier linearizer module 844 and the distortion detector module 846. In some embodiments, the distortion detector module 846 detects distortion (e.g., intermodulation distortion—IMD) in a feedback signal received by the predistortion module 822 (e.g., the feedback signal 866) by comparing an input signal received by the predistortion module 822 (e.g., an IF signal via the IF signal input 854) to the feedback signal. In FIG. 8, distortion in a feedback signal may be introduced by one or more components of the transmitter 800 including, for example, one or more of the power amplifiers 816 and 818.

If the distortion detector module 846 detects that a feedback signal received by the predistortion module 822 contains distortion, the predistortion module 822 generates a predistorted input signal (e.g., based on an IF signal via the IF signal input 854) comprising an "inverse distortion" to cancel nonlinear distortion detected in the feedback signal (e.g., the feedback signal 866). For some embodiments, the power amplifier linearizer module 844 of the predistortion module 822 generates the predistorted input signal, and may do so by inversely modeling gain characteristics or phase characteristics of an input signal, a feedback signal, or both to determine an "inverse distortion" to the distortion detected by the distortion detector module 846. By adding an "inverse distortion" to an input signal received by the predistortion module 822, the predistortion module 822 can be considered to be predistorting the input signal. In FIG. 8, by generating a predistorted input signal, the predistortion module 822 can reduce distortion and increase linearity of a radio frequency (RF) signal that is provided to the antenna by the transmitter 800 via the RF signal output 852. For some embodiments, the feedback signal operates as a control signal to the predistortion module 822 that controls an amount of distortion introduced into the predistorted input signal by the power amplifier linearizer module 844. The resulting predistorted input signal produced by the predistortion module 822 may be provided to the remainder of the transmitter via the VGA 808.

For some embodiments, the predistortion module 822 adds "inverse distortion" to an input to generate an predistorted input signal if the distortion detected in a feedback signal in a feedback signal in a feedback signal (e.g., the feedback signal 866) is equal to, or greater than, a predetermined distortion threshold. In this way, the predetermined distortion threshold may define the amount of distortion the transmitter 800 permits in an RF signal, via the RF signal output 852 (e.g., as observed through the feedback signal 866), before the predistortion module 822 adjusts (e.g., increases or decreases) the "inverse distortion" added in the predistorted input signal. Where distortion detected in the feedback signal does not surpass a predetermined distortion threshold, the predistortion module 822 may permit an input signal to pass through the predistortion module 822 without the addition of "inverse distortion." Depending on the embodiment, the predetermined distortion threshold may be defined by an administrator or operator of the transmitter 800, and may be received by the predistortion module 822 from the microcontroller module 832.

For various embodiments, one or more various operations of the predistortion module 822 are controlled by the microcontroller module 832. The predistortion module 822 may receive control instructions from the microcontroller module 832 by way of a connection 862. Through the connection 862, the predistortion module 822 may provide the microcontroller module 832 with information regarding the predistortion module 822 including, for example, the present operational status of the predistortion module 822. Communication between the predistortion module 822 and the microcontroller module 832 may be facilitated by way of a serial programming interface (SPI) included by the predistortion module 822. The connection 862 may couple to an SPI of the predistortion module 822.

In accordance with some embodiments, the predistortion module 822 can be enabled or disabled based on the current operational mode or phase of the transmitter 800 or one or more of the power amplifiers 816 and 818. For example, when one or more of the power amplifiers 816 and 818 are operated in calibration phase (e.g., to determine a set of optimized quiescent drain current values or a set of calibrated drain current values for the power amplifiers), the predistortion module 822 may be instructed to disable one or more of its functions, including predistorting an intermediate frequency (IF) signal received by the predistortion module 822 via the IF signal input 854. By disabling predistortion by the predistortion module 822 of the intermediate frequency (IF) signal received via the IF signal input 854, the generation of a predistorted input signal by the predistortion module 822 may be considered to be disabled and the IF signal received by the predistortion module 822 may pass through to the predistortion module 822 (e.g., to the VGA 808) as a non-predistorted input signal.

In another example, when one or more of the power amplifiers 816 and 818 are operated in operational phase (e.g., when the transmitter 800 is transmitting an RF signal via the RF signal output 852), the predistortion module 822 may be instructed to enable one or more of its functions, including predistorting an intermediate frequency (IF) signal received by the predistortion module 822 via the IF signal input 854. By enabling predistortion by the predistortion module 822 of the IF signal received via the IF signal input 854, the generation of a predistorted input signal by the predistortion module 822 may be considered to be enabled and the predistortion module 822 may output the resulting predistorted input signal (e.g., to the VGA 808).

The microcontroller module 832 may control the predistortion module 822 based on the instructions inputted to the microcontroller module 832 (e.g., by a technician or operator of the transmitter 800). For instance, during manufacturing of the transmitter 800 or testing of the transmitter 800, a technician may instruct the transmitter 800 to go into the calibration mode, and the microcontroller module 832 in turn instructs the predistortion module 822 to enable or disable certain functions for the calibration of the transmitter 800. When calibration of the transmitter 800 has concluded, the microcontroller module 832 may instruct the predistortion module 822 to reverse the enablement and disablement of functions of the predistortion module 822.

The VGA 808 may be any form of amplifier suitable for receiving an IF or RF signal and providing a variable gain to the IF or RF signal. The VGA 808 may be configured to receive a signal (e.g., predistorted input signal) from the predistortion module 822, apply a gain (e.g., adjust the voltage or current of the signal according to a predetermined gain), and provide the resulting signal to the mixer 810. The VGA 808 may include one or more components, and may comprise different types of VGA with many different electrical properties.

The mixer 810 and the local oscillator 824 may represent an upconverter configured to upconvert a signal from the VGA 808 to generate an upconverted signal. The upconverted signal output by the mixer 810 may be at the final frequency that is to be output by the transmitter 800, to an antenna, via the RF signal output 852. In some embodiments, the mixer 810 mixes a signal received from the VGA 808 with an oscillating signal from the local oscillator 824.

For various embodiments, multiple local oscillators are utilized, each providing an oscillating signal to the mixer 810 and the mixer 840, respectively. The mixers 810 and 840 may comprise many different types of mixers with many different electrical properties. Each of the mixers 810 and 840 may include one or more components.

The local oscillator 824 may provide an oscillating signal used to upconvert and/or downconvert a signal. The local oscillator 824 may comprise any kind of oscillator with any different electrical properties. For some embodiments, the local oscillator 824 may be replaced by one or more remote oscillators that are remotely located with respect to the transmitter 800. The local oscillator 824 may be replaced by one or more remote oscillators configured to provide an oscillating signal to one or more transmitting radio frequency units. The local oscillator 824 may include one or more components.

The VVA 812 may be configured to adjust one or more electrical properties of the RF signal provided by the mixer 810 including, for example, the voltage, current, or power of the RF signal. The VVA 812 may be further configured to variably adjust the RF signal according to a control signal 856, which may be received from the microcontroller module 832 by way of the DAC 826.

For some embodiments, the VVA 812 is utilized to set or otherwise adjust the power level of the power amplifiers 816 and 818 and may do so by adjusting the power of the input signal (e.g., the RF signal) that the VVA 812 provides to the power amplifier 816 through the gain block 814, which in turn influences the output signal the power amplifier 816 provides to the power amplifier 818. In a two-stage power amplifier configuration as shown in FIG. 8, the VVA 812 may be utilized to set or otherwise adjust the power level of the power amplifier 818. When the power amplifiers 818 is in operation mode, an adaptive closed-loop control may be utilized to adjust the drain current of the power amplifier 818, and the VVA 812 may be used to set or adjust the power level of the power amplifier 818 to reach a desired power level for the power level of an RF signal output via the RF signal output 852. Likewise, when the power amplifiers 816 is in operation mode, an adaptive closed-loop control may be utilized to adjust the drain current of the power amplifier 816, and the VVA 812 may be used to set or adjust the power level of the power amplifier 816 to reach a desired power level for the power level of an RF signal output via the RF signal output 852. As described herein, the VVA 812 may be utilized in setting the power level of the power amplifiers 816 and 818 during adaptive power control of the power amplifiers 816 and 818, which may utilize a proportional-integral-derivative (PID) process.

The gain block 814 may be any form of amplifier suitable for receiving an IF or RF signal and providing a gain to the IF or RF signal. The gain block 814 may be configured to receive the variably-attenuated RF signal from the VVA 812, apply a gain (e.g., a predetermined gain), and provide the resulting RF signal to the power amplifier 816. Depending on the embodiment, the driver 22 may be any amplifier and/or attenuator.

Each of the power amplifiers 816 and 818 may be a GaN power amplifier, and may be configured to receive an input signal (e.g., via a signal input port), amplify the input signal to an output signal, and provide the output signal (e.g., via a signal output port). In FIG. 8, the power amplifiers 816 and 818 are configured to function as a two-stage amplifier, which as a while permits a larger amplification of the input signal provided by the gain block 814 than otherwise possible using a single power amplifier (single-stage amplifier). As a two-stage amplifier, the power amplifiers 816 and 818 may have useful where the transmitter generates a microwave RF signal for transmission. As shown, each of the power amplifiers 816 and 818 may receive and be powered by a drain current ($I_{d1}$ and $I_{d2}$) provided by the DC power supply 802. Amplification of the input signal to an output signal by the power amplifier 816 may be based on (e.g., controlled by) a bias being applied to the power amplifier 816 (e.g., applied to the power amplifier 816's gate) as a control input. Amplification of the input signal to an output signal by the power amplifier 818 may be similarly based on (e.g., controlled by) a bias being applied to the power amplifier 816 (e.g., applied to the power amplifier 816's gate) as a control input. As shown in FIG. 8, the bias applied to the power amplifier 816 may be a voltage bias $V_{g1}$ being provided by the voltage converter 828, and the bias applied to the power amplifier 818 may be a voltage bias $V_{g2}$ being provided by the voltage converter 830. Depending on the embodiment, the systems and processes described herein may apply a closed-loop control to the drain current of the power amplifier 816, the power amplifier 818, or both during operation mode of the power amplifier 818 and 818. Although two power amplifiers 816 and 818 are depicted in FIG. 8, those skilled in the art will appreciate that there may be any number of power amplifiers present in the transmitter 800. For instance, multiple the power amplifiers 816 and 818 may be a part of a matching network.

The voltage converter 828 may be configured to generate and provide voltage bias $V_{g1}$ according to a control signal 858 received from the microcontroller module 832 as converted by the DAC 826. Likewise, the voltage converter 830 may be configured to generate and provide voltage bias $V_{g2}$ according to a control signal 860 received from the microcontroller module 832 as converted by the DAC 826. Once the RF signal received by the power amplifier 816 is amplified, amplified by the power amplifier 816, received by the power amplifier 818, and amplified by the power amplifier 818, the resulting amplified RF signal may be provided for transmission via an RF signal output 852.

The coupler 820 may be configured to sample or split a signal (e.g., an amplified RF signal) being output from the power amplifier 818. In some embodiments, the coupler 820 samples the output signal from the power amplifier 818 and provides the sampled signal to the RF detector 834 for feedback processing. Upon receiving the sampled signal, the RF detector 834 may be configured to detect the presence of the signal or determine one or more characteristics of the sampled signal including, for instance, the frequency, phase, power level (e.g., amplitude) of the received sampled signal. The RF detector 834 may inform another component of the sample signal's presence or characteristics via the connection 848. For instance, the RF detector 834 may inform the microcontroller module 832 of the sample signal's presence or characteristics through ADC 836 and via the connection 848.

In various embodiments, the coupler 820 also provides the sampled signal as a feedback signal to the predistortion module 822 via a feedback path. In particular, the coupler 820 may provide the sample signal to the fixed voltage attenuator 842.

The fixed voltage attenuator 842 may be configured to prevent the mixer 840 to be overdriven by the sampled signal provided by the coupled 820. The fixed voltage attenuator 842 may be further configured to provide enough spectral range to enable the predistortion module 822 to generate a predistorted input signal to the VGA 808. For some embodiments, the fixed voltage attenuator 842 may be replaced by an attenuator capable of variable adjustment (e.g., attenuation or gain) of a characteristic of the signal provided by the coupler 820.

The mixer 840 and the local oscillator 824 may represent a downconverter configured to downconvert a sampled signal received from the coupler 820 via the fixed voltage attenuator 842. Downconverting the sampled signal in this manner may allow the mixer 840 to provide a feedback signal for use by the predistortion module 822. The feedback signal may be at an intermediate frequency (IF). In some embodiments, the mixer 840 mixes a signal received from the fixed voltage attenuator 842 with an oscillating signal from the local oscillator 824.

The VGA 838 may be any form of amplifier suitable for receiving an IF or RF signal and providing a variable gain to the IF or RF signal. The VGA 838 may be configured to receive a signal (e.g., feedback signal) from the mixer 840, apply a gain (e.g., adjust the voltage or current of the signal according to a predetermined gain), and provide the resulting signal to the predistortion module 822. The VGA 838 may include one or more components, and may comprise different types of VGA with many different electrical properties.

The microcontroller module 832 may be configured to control one or more components of the transmitter 800 via one or more control signal outputs. Additionally, the microcontroller module 832 may be configured to control one or more components of the transmitter 800 according to input signals received from one or components of the transmitter 800. The microcontroller module 832 may include a processor to facilitate its operation. As described herein, the microcontroller module 832 may be implemented, in whole or in part, using a digital device. Analog signals to the microcontroller module 832 (e.g., from the drain current sensors 804 and 806 and the RF detector 834) may converted to a digital signal by the ADC 836 before they are received by the microcontroller module 832, and digital signals from the microcontroller module 832 (e.g., for the VVA 812 and for the voltage converters 828 and 830) may be converted to analog signals by the DAC 826. For some embodiments, one or more of the methods described herein are performed, in whole or in part, by the microcontroller module 832. The processor included by the microcontroller module 832 may facilitate the performance of steps or operations described herein as described herein.

For some embodiments, the microcontroller module 832 controls the VVA 812 via a control signal provided by the DAC 826 over the connection 848, and the VVA 812 in turn controls the input signal provided to the power amplifier 816 via the gain block 814. As described herein, the VVA 812 may control the power level of the power amplifiers 816 and 818 (e.g., of the output signal of each of the power amplifiers 816 and 818) by controlling the input signal provided to the power amplifier 816 by the VVA 812. In some embodiments, the microcontroller module 832 adaptively controls power of both the power amplifier 816 and the power amplifier 818, via the VVA 812, using a proportional-integral-derivative (PID) process. For instance, the microcontroller module 832 compares the actual output power provided by the power amplifier 818, as measured by the RF detector 834, with a desired or expected output power for the power amplifiers 816 and 818, and uses a PID algorithm to adaptively control the VVA 812 to adjust the power level of the input signal provided to the power amplifier 816 to achieve the desired or expected output power from the power amplifiers 816 and 818.

In some embodiments, when applying a closed-loop control to the drain current of the power amplifier 816 or the power amplifier 818, the microcontroller module 832 adaptively controls the power of the input signal provided to the power amplifier 816 and then sets the drain current of the power amplifier 816 or the power amplifier 818 according to a target drain current value associated with the present operational parameter (e.g., temperature or frequency) and power level measured by the RF detector 834. As described herein, the target drain current value may be one determined, and stored as calibrated drain current data, during a calibration process as described herein. For some embodiments, the microcontroller module 832 adaptively controls the power of the power amplifiers 816 and 818 and then sets the drain current of the power amplifier 818, the power amplifier 818, or both according to a respective target drain current value (e.g., from the calibrated drain current data) when the power amplifiers 816 and 818 are operating in a low-power mode (e.g., power level of the output signal of the power amplifier 818 is lower than the sensitivity power level).

In various embodiments, the microcontroller module 832 controls the drain current of the power amplifier 816 by controlling a bias to the power amplifier 816's gate voltage ($V_{g1}$), and the microcontroller module 832 controls the drain current of the power amplifier 818 by controlling a bias to the power amplifier 818's gate voltage ($V_{g2}$). In FIG. 8, the bias to the power amplifier 816's gate voltage through the control signal 858 to the voltage converter 828, and the bias to the power amplifier 818's gate voltage through the control signal 860 to the voltage converter 830.

Figure 9:
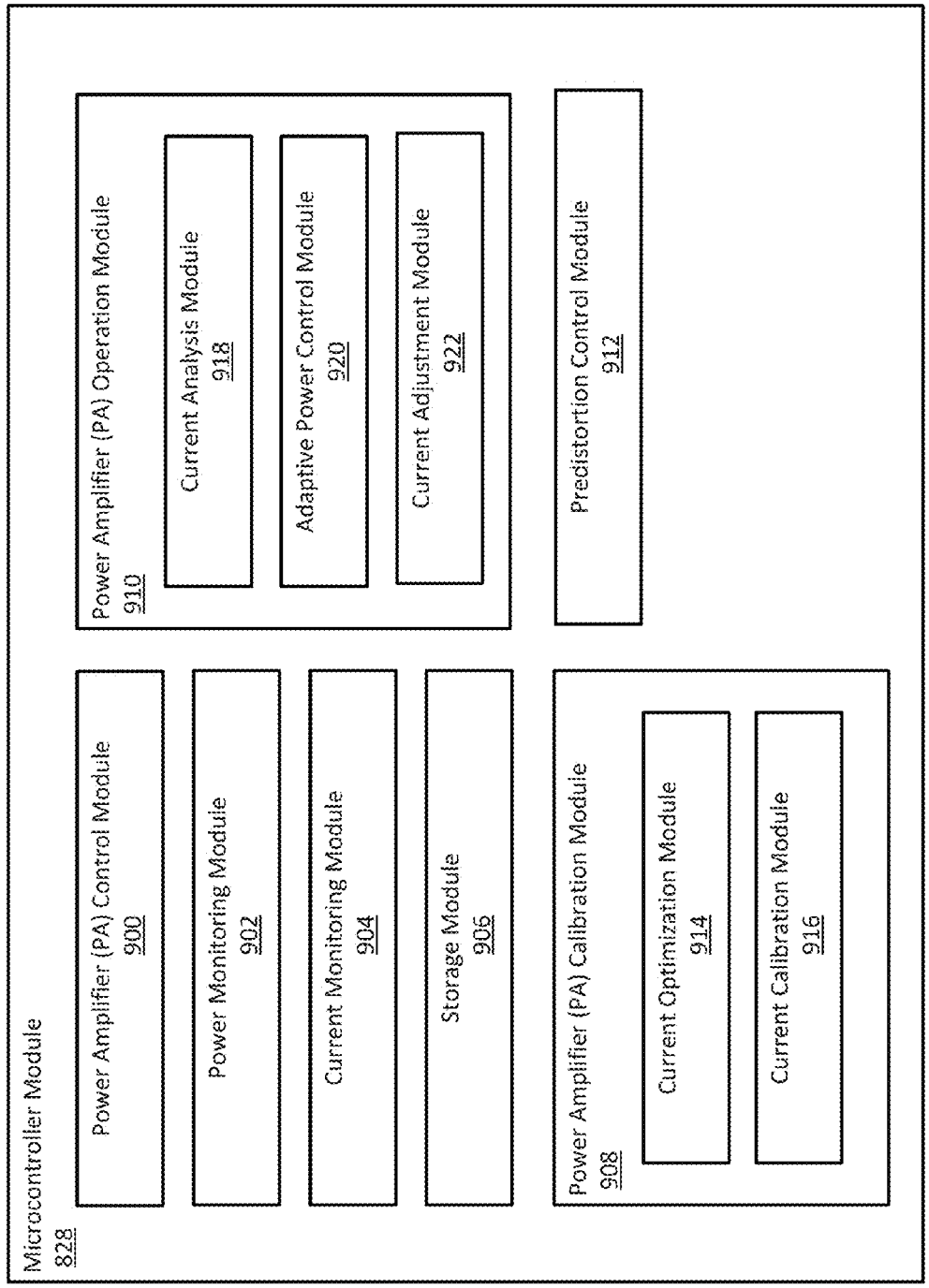
FIG. 9 is a block diagram of an example microcontroller module that can be utilized with a power amplifier in accordance with some embodiments.

FIG. 9 is a block diagram of an example microcontroller module 832 that can be utilized with a power amplifier in accordance with some embodiments. In FIG. 9, the microcontroller module 832 comprises a power amplifier (PA) control module 900, a power monitoring module 902, a current monitoring module 904, a storage module 906, a power amplifier (PA) calibration module 908, a power amplifier (PA) operation module 910, and a predistortion control module 912. The PA calibration module 908 comprises a current optimization module 914 and a current calibration module 916. The PA operation module 910 comprises a current analysis module 918, an adaptive power control module 920, and a current adjustment module 922. Those skilled in the art will appreciate that the composition or arrangement of microcontroller module 832 may vary between different embodiments. As described herein, one or more of the methods described herein may be performed, in whole or in part, by the microcontroller module 832. As also described herein, the microcontroller module 832 may be implemented, in whole or in part, using a digital device, and that digital device may be similar to the one described and depicted with respect to FIG. 7.

The PA control module 900 may be configured to facilitate control of the power amplifier 312, and may do so by controlling drain current of the power amplifier 312. For some embodiments, the PA control module 900 controls the drain current of each of the power amplifiers 816 and 818 by controlling their respective voltage bias $V_{g1}$ and $V_{g2}$. In some embodiments, the voltage converter 828 provides the voltage bias $V_{g1}$ to the power amplifier 816, and the PA control module 900 controls the voltage converter 828 via control signals through the DAC 318. Additionally, in some embodiments, the voltage converter 320 provides the voltage bias $V_{g2}$ to the power amplifier 816, and the PA control module 900 controls the voltage converter 830 via control signals through the DAC 318.

The current monitoring module 904 may be configured to facilitate measurement of the drain current of each of the power amplifiers 816 and 818, and may respectively do so by through the drain current sensors 804 and 806. According to some embodiments, the drain current sensor 804 measures the drain current provided by the DC power supply 302 to the power amplifier 816, and provides the measured value to the current monitoring module 904 as a signal. Similarly, the drain current sensor 806 measures the drain current provided by the DC power supply 302 to the power amplifier 818, and provides the measured value to the current monitoring module 904 as a signal. The signal provided by the drain current sensors 804 and 806 may be analog and require conversion through the ADC 836 before being received by the current monitoring module 904.

The storage module 906 may be configured to facilitate storage and retrieval of various data as various components of the microcontroller module 832 perform operations. In some embodiments, the storage module 906 stores and subsequently retrieves drain current values used by the PA calibration module 908 or the PA operation module 910 during a calibration or operation phase of the power amplifiers 816 and 818. The storage module 906 may utilize or include some form of memory (e.g., flash memory) or datastore to facilitate storage and retrieval of data for operations of the microcontroller module 832. In certain embodiments, the storage module 906 stores a set of drain current values, in association with operational parameters, and calibrated with a set of power levels of the power amplifiers 816 and 818. The storage module 906 may store the set of drain current values to, and subsequently retrieve drain current values from, a calibration file.

Depending on the embodiment, the PA calibration module 908 and the PA operation module 910 may be used to calibrate and operate the power amplifier 816, the power amplifier 818, or both (e.g., in a calibration phase and in an operation phase). For embodiments involving a two-stage power amplifier configuration similar to that of the power amplifier 816 and 818, the PA calibration module 908 and the PA operation module 910 perform operations primarily with respect to the power amplifier at the latest stage (i.e., the power amplifier 818), as it is the last power amplifier to influence signal produced by the power amplifiers 816 and 818.

The PA calibration module 908 may be configured to facilitate calibration phase operations, as described herein, with respect to the power amplifier 816, the power amplifier 818, or both. For instance, during calibration of the power amplifier 818, the current optimization module 914 may be configured to determine one or more quiescent drain current ($I_{dq}$) values for the power amplifier 818 for one or more operational parameters under which the power amplifier 818 may be operated, or is expected to operate, when used for signal transmission in the transmitter 800. The operational parameters for the power amplifiers 816 and 818 may, for example, comprise permutations of the following operational parameters: a set of frequencies $F=\{f_1, f_2, f_3, \ldots f_p\}$ expected for the input signals during operation of the power amplifier 312; and a set of power amplifier temperatures $T=\{t_1, t_2, t_3, \ldots t_m\}$ expected during operation of the power amplifier 816 and 818. Determining one or more quiescent drain current ($I_{dq}$) values for the power amplifier 818 operating under the operational parameters may comprise adjusting the quiescent drain current ($I_{dq}$) of the power amplifier 818, via the voltage bias $V_{g2}$ applied by the voltage converter 830, while the power amplifier 818 is operating under the operational parameters. The quiescent drain current ($I_{dq}$) values determined during by the current optimization module 914 may be regarded as a set of optimized quiescent drain current ($I_d$) values for the power amplifier 818 while operating under the operational parameters. Additionally, the one or more quiescent drain current ($I_{dq}$) values determined by the current optimization module 914 for the power amplifier 818 may be stored as calibrated drain current data by the storage module 906, and may be done so according to their one or more corresponding operational parameters, output power levels, or both (e.g. to permit future retrieval based on those operational parameters, output power levels, or both). In accordance with some embodiments, while determining one or more quiescent drain current ($I_{dq}$) values for the power amplifier 818, the generation of the predistorted input signal by the predistortion module 822 is disabled.

The current calibration module 916 may be configured to determine a set of non-quiescent drain current ($I_{dnq}$) values for the power amplifier 818 for a set of power levels $P=\{p_1, p_2, p_3, \ldots p_n\}$ and additional operational parameters under which the power amplifier 818 may be operated, or is expected to operate when used for signal transmission in the transmitter 800. The additional operational parameters may comprise permutations of the following operational parameters: a set of frequencies $F=\{f_1, f_2, f_3, \ldots f_p\}$ expected for the input signals during operation of the power amplifiers 816 and 818; and a set of power amplifier temperatures $T=\{t_1, t_2, t_3, \ldots t_m\}$ expected during operation of the power amplifiers 816 and 818. The non-quiescent drain current ($I_{dnq}$) values determined by the current calibration module 916 may be regarded as a set of calibrated drain current ($I_d$) values for the power amplifier 818 while operating under the operational parameters. Additionally, the non-quiescent drain current ($I_{dnq}$) values determined by the current calibration module 916 for the power amplifier 818 may be stored as calibrated drain current data by the storage module 906, and may be done so according to their one or more corresponding operational parameters (e.g. to permit future retrieval based on those operational parameters). In accordance with some embodiments, while determining one or more non-quiescent drain current ($I_{dnq}$) values for the power amplifier 818, the generation of the predistorted input signal by the predistortion module 822 is disabled.

The PA operation module 910 may be configured to facilitate operation phase operations, as described herein, with respect to the power amplifier 816, the power amplifier 818, or both. During the operation phase of the power amplifier 818 (e.g., when the power amplifier 818 is being used in the transmitter 800 to transmits signals), the current analysis module 918 may be configured to receive a present value of the drain current of the power amplifier 818 as measured by the drain current sensor 806, and compare the present drain current value to a saved drain current value (e.g., an optimized quiescent drain current value or a calibrated drain current value) determined during the calibration phase and saved through the storage module 906. Through the storage module 906, the current analysis module 918 may obtain the saved drain current value from the calibrated drain current data. As described herein, for some embodiments, the saved drain current value to which the present drain current value is compared is a saved drain current value that associated with one or more present operational parameters under which the power amplifier 818 is presently operating while the transmitter 800 is operating. In accordance with some embodiments, during the operation phase of the power amplifier 818, the generation of the predistorted input signal by the predistortion module 822 is enabled.

Based on whether the difference between the present drain current value and the saved drain current value satisfies a particular condition, the current analysis module 918 may maintain the drain current at its present drain current value or control (e.g., adjust) the drain current to match or sufficiently match the saved drain current value.

The adaptive power control module 920 may be configured to adaptively control the power of the power amplifier 816, the power amplifier 818, or both. According to some embodiments, the adaptive power control module 920 controls the VVA 812 via the control signal 856 provided by the DAC 826, and the VVA 812 in turn controls the input signal provided to the power amplifiers 816 via the gain block 814. As described herein, the VVA 812 may control the power level of the power amplifiers 816 and 818 (e.g., of the output signal of the power amplifier 818) by controlling the input signal provided to the power amplifier 816. The adaptive power control module 920 may adaptively control power of the power amplifiers 816 and 818, via the VVA 812, using a proportional-integral-derivative (PID) process. The adaptive power control module 920 may compare the actual output power provided by the power amplifier 818, as measured by the RF detector 834, with a desired or expected output power for the power amplifiers 816 and 818, and then use a PID algorithm to adaptively control the VVA 812 to adjust the power level of the input signal provided to the power amplifier 816 to achieve the desired or expected output power from the power amplifiers 816 and 818.

The current adjustment module 922 may be configured to control the drain current (e.g., while applying a closed-loop control to the drain current) when the drain current needs to be controlled to match or sufficiently match the present drain current value to the saved drain current value. According to some embodiments, the current adjustment module 922 controls the drain current to the saved drain current value by controlling the voltage bias $V_{g2}$ applied by the voltage converter 830 to the power amplifier 818's gate and measuring the present drain current value of the power amplifier 818 (as provided by the drain current sensor 806) until the present drain current value of the power amplifier 818 matches or substantially matches the saved drain current value.

The predistortion control module 912 may be configured to facilitate control of various operations with respect to the predistortion module 822. According to some embodiments, the predistortion control module 912 sends control instructions to the predistortion module 822 to enable or disable various functions of the predistortion module 822. The predistortion control module 912 may further monitor the status of the predistortion module 822 (e.g., enabled or disabled). For example, upon request by the predistortion control module 912, the predistortion module 822 may inform the predistortion control module 912 whether the predistortion module 822 is operational status (e.g., enabled or disabled), or functionality currently enabled or disabled by the predistortion module 822. The predistortion control module 912 may communicate with the predistortion module 822 via a serial programming interface (SPI) included by the predistortion module 822. The predistortion control module 912 may communicate with the predistortion module 822 via the connection 862.

In some embodiments, when one or more of the power amplifiers 816 and 818 are operated in calibration phase (e.g., to determine a set of optimized quiescent drain current values or a set of calibrated drain current values for the power amplifiers), the predistortion control module 912 may instruct the predistortion module 822 to disable one or more of its functions, including predistorting an intermediate frequency (IF) signal received by the predistortion module 822 via the IF signal input 854. Similarly, when one or more of the power amplifiers 816 and 818 are operated in operational phase (e.g., when the transmitter 800 is transmitting an RF signal via the RF signal output 852), the predistortion control module 912 may instruct the predistortion module 822 to enable one or more of its functions, including predistorting an intermediate frequency (IF) signal received by the predistortion module 822 via the IF signal input 854.

Those skilled in the art will appreciate that the components of FIG. 8 described above with respect to the components of FIG. 9 are merely examples of components that may be used with the microcontroller module 832, and that other components may also be utilized in some embodiments.

Figure 10:
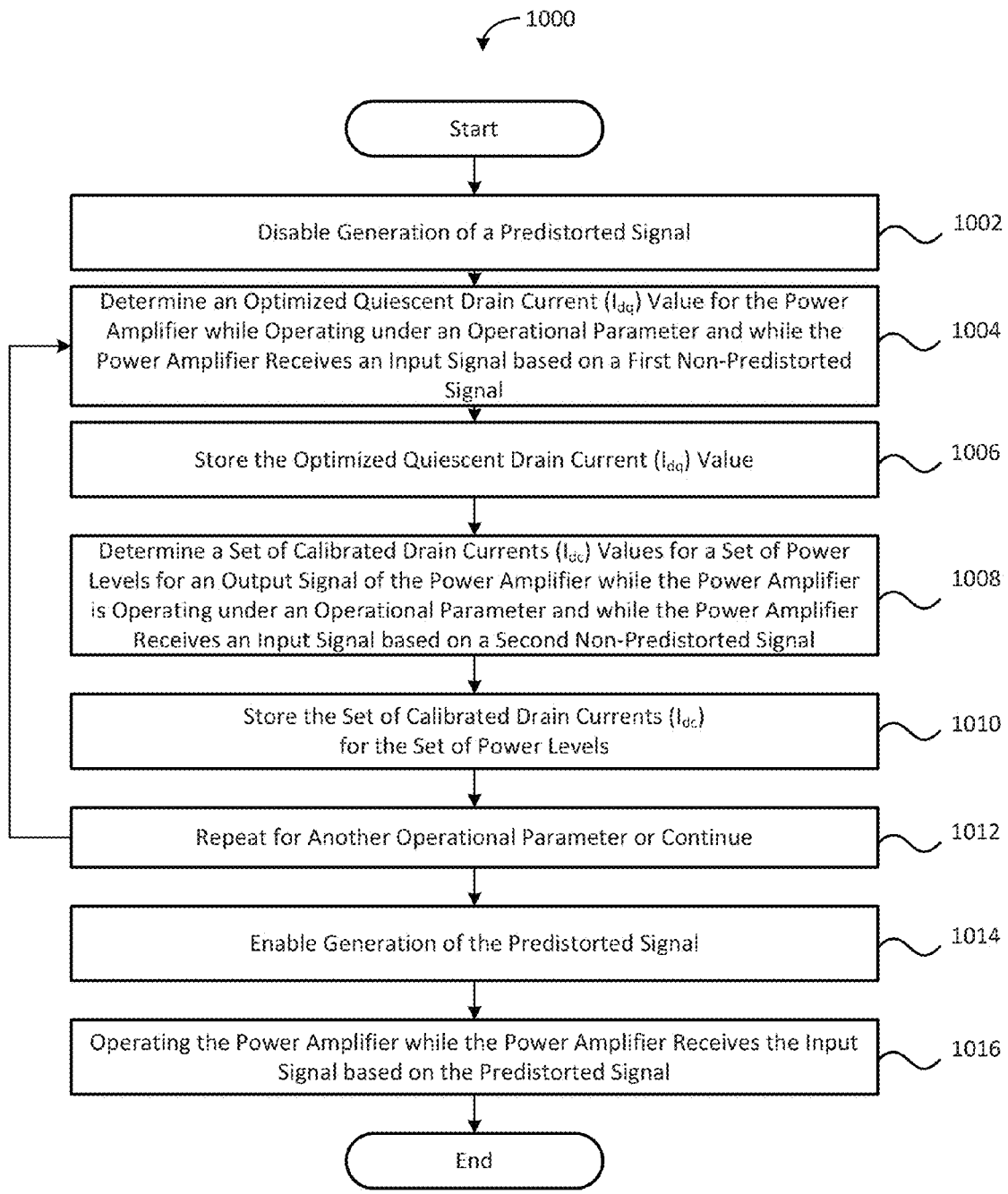
FIG. 10 is a flow diagram of an example method for operating a power amplifier in accordance with some embodiments.

FIG. 10 is a flow diagram of an example method 1000 for operating a power amplifier in accordance with some embodiments. Though the steps of the method 1000 will be described below with respect to the power amplifier 818 alone, those skilled in the art will appreciate that this is merely for illustrative purposes. It will be understood that for some embodiments, the method 1000 may be performed with respect to the power amplifier 816 alone or both the power amplifier 816 and the power amplifier 818.

The method 1000 begins at step 1002 with the predistortion control module 912 controlling the predistortion module 822 (e.g., instructing the predistortion module 822) to disable generation of a predistorted signal. In accordance with some embodiments, disabling generation of the predistorted signal comprises instructing the predistortion module 822 to disable generation of a predistorted input signal based on an intermediate frequency (IF) signal received via the IF signal input 854, and allowing the IF signal to pass through the predistortion module 822, as a non-predistorted input signal, to the VGA 808. As described herein, when the power amplifier 818 is being operated in calibration phase, the predistortion control module 912 may instruct the predistortion module 822 to disable generation of the predistorted input signal, and permit the IF signal to pass through as a non-predistorted input signal. As also described herein, during the calibration phase, a set of optimized quiescent drain current values may be determined for the power amplifier 818, and a set of calibrated drain current values may be determined for the power amplifier 818.

At step 1004, the current optimization module 914 determines an optimized quiescent drain current ($I_{dq}$) value for the power amplifier 818 while the power amplifier 818 is operating under an operational parameter and while a power amplifier input signal received by the power amplifier 818 is based on a first non-predistorted signal. At step 1006, the storage module 906 stores the optimized quiescent drain current ($I_{dq}$) value, and may store it as calibrated drain current data. In some embodiments, the optimized quiescent drain current data is stored in a calibration file that can be utilized during operation of the power amplifier 818. As described herein, based on a target drain current value provided by the calibration file (e.g., for a given operational parameter and power level of the power amplifier 818), the gate voltage of the power amplifier 818 can be biased to achieve the target drain current value. At step 1008, the current calibration module 916 determines a set of calibrated drain current ($I_{dc}$) values for a set of power levels for an output signal of the power amplifier 818 while the power amplifier 818 is operating under the operational parameter and while the power amplifier input signal received by the power amplifier 818 is based on a second non-predistorted signal. The second non-predistorted signal may be similar to the first non-predistorted signal. At step 1010, the storage module 906 stores the set of calibrated drain current ($I_{dc}$) values, and may store it as calibrated drain current data. In some embodiments, the calibrated drain current data is stored in a calibration file that can be utilized during operation of the power amplifier 818. As described herein, based on a target drain current value provided by the calibration file (e.g., for a given operational parameter and power level of the power amplifier 818), the gate voltage of the power amplifier 818 can be biased to achieve the target drain current value. At step 1012, the method 1000 can return to step 1004 and repeat the method 1000 for another operational parameter, or continue to step 1014.

At step 1014, the predistortion control module 912 controls the predistortion module 822 (e.g., instructs the predistortion module 822) to enable generation of a predistorted signal. In accordance with some embodiments, enabling generation of the predistorted signal comprises instructing the predistortion module 822 to (adaptively) generate a predistorted input signal based on an intermediate frequency (IF) signal received via the IF signal input 854. The predistorted input signal may be provided to the VGA 808 for continued processing in the transmitter. As described herein, when the power amplifier 818 is being operated in operation phase, the predistortion control module 912 may instruct the predistortion module 822 to enable generation of the predistorted input signal based on the IF signal. As also described herein, during the operation phase, the set of optimized quiescent drain current values determined at step 1004, the set of calibrated drain current values may be determined for the power amplifier 818 at step 1008, or both may be utilized in operating the power amplifier 818.

At step 1016, the power amplifier 818 is operated such that the power amplifier 818 receives an input signal based on the predistorted input signal provided by the predistortion module 822. As described herein, during the operation phase, the power amplifier 818 may receive an input signal based on the predistorted input signal provided by the predistortion module 822, and the predistortion module 822 may adaptively generate the predistorted input signal based on the intermediate frequency (IF) signal via the IF signal input 854 and the feedback signal 866 (e.g., as provided by the VGA 838).

Though the steps of the method 1000 may be depicted and described in a certain order, those skilled in the art will appreciate that the order in which the steps are performed may vary between different embodiments. Additionally, those skilled in the art will appreciate that the components described above with respect to the method 1000 are merely examples of components that may be used with the method 1000, and that other components may also be utilized in some embodiments.

Figure 11:
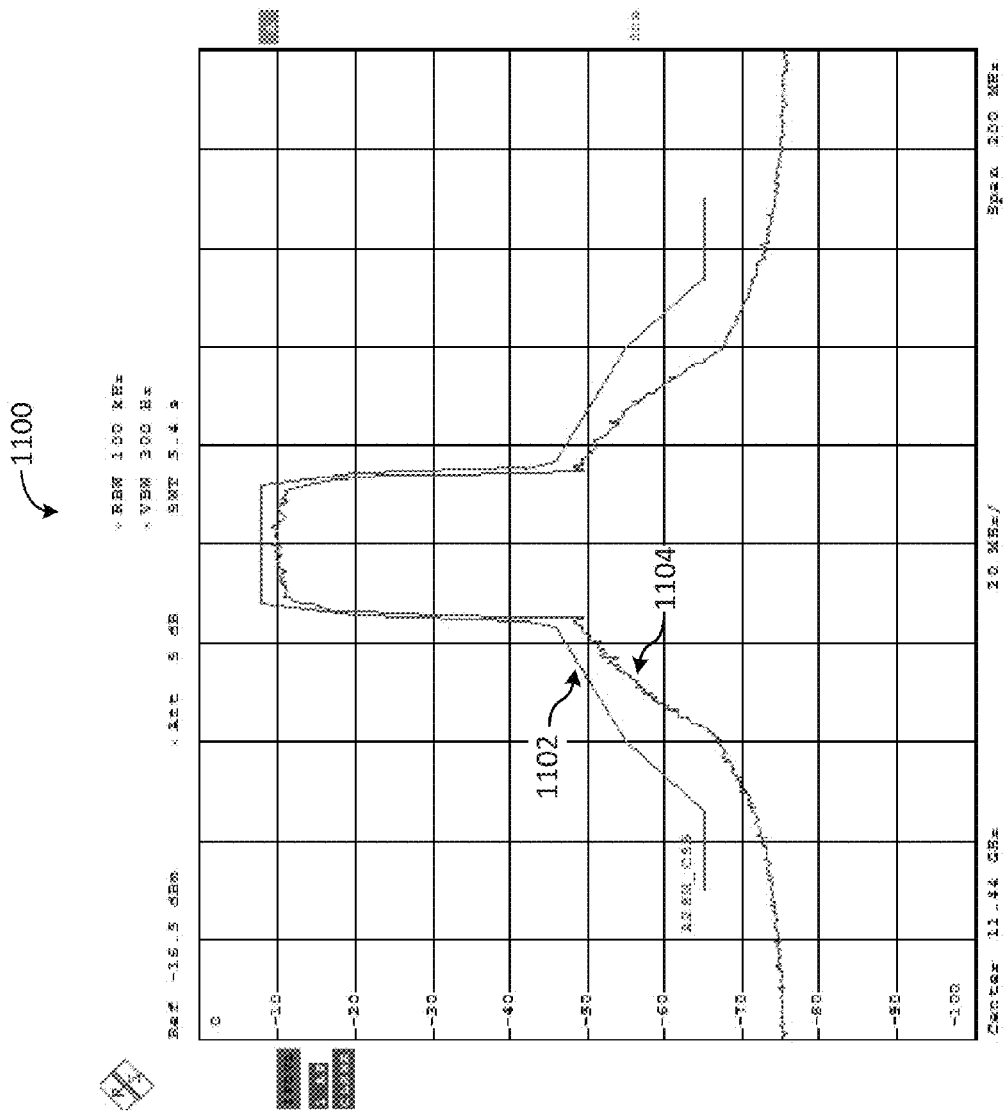
FIG. 11 is a chart depicting an example of a spectral mask for a radio frequency (RF) transmitter operating under an ETSI standard in accordance with some embodiments.

FIG. 11 is a chart 1100 depicting an example of a spectral mask for a radio frequency (RF) transmitter operating under an ETSI standard in accordance with some embodiments. The chart 1100 of FIG. 11 illustrates how with 256-QAM/28 MHz ETSI channel spacing, the transmitting spectrum at antenna port needs to be −55 dBc down at F0+/−70 MHz in order to be within the MASK for a 3-17 GHz RF transmitter. In particular, the chart 1100 indicates an ETSI mask that requires an RF transmitter to have low $5^{th}$ order distortion. In the chart 1100, line plot 1102 depicts the ETSI mask, while line plot 1104 illustrates bias current of a GaN amplifier operating with a predistorter, in an ETSI-compliant RF transmitter, in accordance with some embodiments. For certain embodiments, the bias current of a GaN amplifier (or other power amplifier) is optimized for use in an RF transmitter operating in compliance with an ETSI standard.

Figure 12:
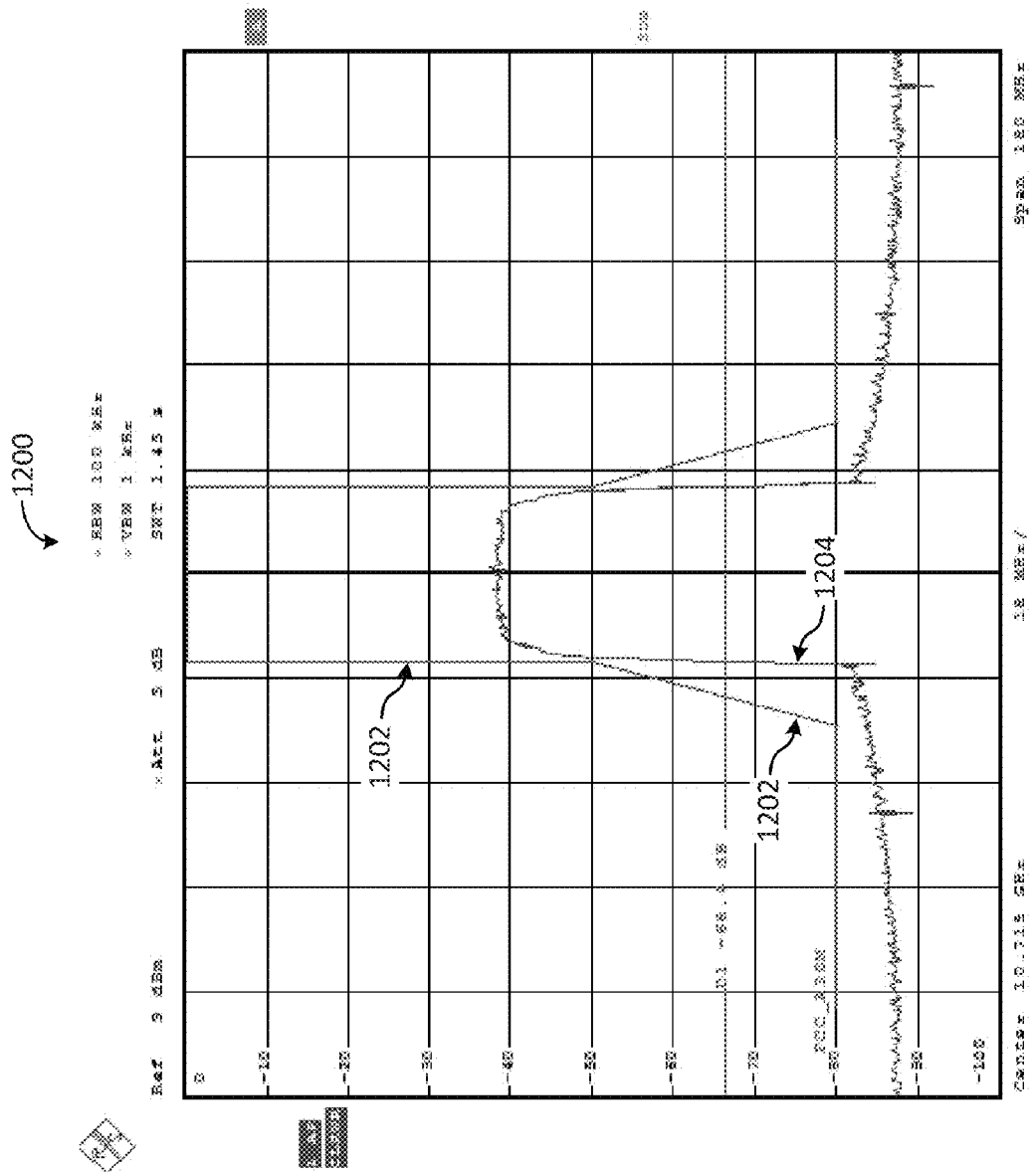
FIG. 12 is a chart depicting an example of a spectral mask for a radio frequency (RF) transmitter operating under an ANSI standard in accordance with some embodiments.

FIG. 12 is a chart 1200 depicting an example of a spectral mask for a radio frequency (RF) transmitter operating under an ANSI standard in accordance with some embodiments. In particular, the chart 1200 illustrates a 256-QAM/30 MHz ANSI mask emphasizing $3^{rd}$ order distortion. In the chart 1100, line plot 1202 depicts the ANSI mask, while line plot 1204 illustrates bias current of a GaN amplifier operating with a predistorter, in an ANSI-compliant RF transmitter, in accordance with some embodiments. For certain embodiments, the bias current of a GaN amplifier (or other power amplifier) is optimized for use in an RF transmitter operating in compliance with an ANSI standard.

In various embodiments, the optimized drain currents for a power amplifier used in a radio frequency (RF) transmitter is performed as part of an auto calibration process, which may take place at the time of the RF transmitter's manufacture. During a calibration process, an automated calibration station may first identifying a transmitter as ETSI or ANSI-compliance transmitter, and then tune the bias current of the transmitter's power amplifier for the best match of a frequency spectrum to the mask for the (ETSI or ANSI) standard. The use of adaptive predistortion with a power amplifier operating according to drain currents optimized for a specific application (e.g., ETSI or ANSI application) may provide for a radio frequency (RF) transmitter having improved mask matching and higher radio frequency (RF) power levels from a transmitter. Those skilled in the art will appreciate that a power amplifier may be calibrated for applications other than RF transmission, and/or may be calibrated for other regulatory standards.

Various embodiments are described herein as examples. It will be apparent to those skilled in the art that various modifications may be made and other embodiments can be used.

We claim:

1. A method comprising:
   determining an optimized quiescent drain current value for a drain current of a power amplifier while the power amplifier is operating under an operational parameter and while a power amplifier input signal received by the power amplifier is based on a first non-predistorted signal;
   storing the optimized quiescent drain current value as saved drain current data;
   determining a set of calibrated drain current values for the drain current, the set of calibrated drain current values being calibrated for a set of power levels for a power amplifier output signal while the power amplifier is operating under the operational parameter and while the power amplifier input signal received by the power amplifier is based on a second non-predistorted signal;
   storing the set of calibrated drain current values in the saved drain current data;
   comparing a present drain current value of the drain current to a particular drain current value in the saved drain current data while the power amplifier input signal received by the power amplifier is based on a predistorted signal;
   determining whether the comparing the present drain current value to the particular drain current value satisfies a condition; and
   adjusting the drain current based on the particular drain current value if the condition is determined to be satisfied.

2. The method of claim 1, wherein the predistorted signal is generated by a predistorter module configured to detect existing distortion in an initial signal and to generate the predistorted signal based on the detected existing distortion.

3. The method of claim 1, wherein the first non-predistorted signal or the second non-predistorted signal is generated by disabling generation of the predistorted signal by a predistorter module.

4. The method of claim 3, further comprising disabling generation of the predistorted signal by the predistorter module.

5. The method of claim 3, further comprising enabling generation of the predistorted signal by the predistorter module.

6. The method of claim 1, wherein the power amplifier is a GaN power amplifier.

7. The method of claim 1, wherein the operational parameter comprises a plurality of operational parameters.

8. The method of claim 1, wherein the operational parameter comprises a frequency of the power amplifier input signal, a phase of the power amplifier input signal, a power level of the power amplifier input signal, or a temperature of the power amplifier.

9. The method of claim 1, wherein storing the optimized quiescent drain current value comprises storing the optimized quiescent drain current value in association with the operational parameter.

10. The method of claim 1, wherein storing the set of calibrated drain current values comprises storing the set of calibrated drain current values in association with the operational parameter or the set of power levels.

11. The method of claim 1, wherein the condition is that a difference between the present drain current value and the particular drain current value in the saved drain current data is less than, equal to, or larger than a predetermined value.

12. The method of claim 1, wherein adjusting the drain current based on the particular drain current value comprises adjusting the drain current to match or substantially match the particular drain current value in the saved drain current data.

13. The method of claim 1, wherein adjusting the drain current based on the particular drain current value comprises adjusting a voltage bias of the power amplifier such that the drain current matches or substantially matches the particular drain current value in the saved drain current data.

14. A system comprising:
   means for determining an optimized quiescent drain current value for a drain current of a power amplifier while the power amplifier is operating under an operational parameter and while a power amplifier input signal received by the power amplifier is based on a first non-predistorted signal;

means for storing the optimized quiescent drain current value as saved drain current data;
means for determining a set of calibrated drain current values for the drain current, the set of calibrated drain current values being calibrated for a set of power levels for a power amplifier output signal while the power amplifier is operating under the operational parameter and while the power amplifier input signal received by the power amplifier is based on a second non-predistorted signal;
means for storing the set of calibrated drain current values in the saved drain current data;
means for comparing a present drain current value of the drain current to a particular drain current value in the saved drain current data while the power amplifier input signal received by the power amplifier is based on a predistorted signal;
means for determining whether the comparing the present drain current value to the particular drain current value satisfies a condition; and
means for adjusting the drain current based on the particular drain current value if the condition is determined to be satisfied.

15. A system comprising:
a power amplifier having a power amplifier input signal, a power amplifier output signal and a drain current;
a power amplifier calibration module configured to determine an optimized quiescent drain current value for the drain current while the power amplifier is operating under an operational parameter and while the power amplifier input signal received by the power amplifier is based on a first non-predistorted signal, and to determine a set of calibrated drain current values for the drain current, the set of calibrated drain current values being calibrated for a set of power levels for the power amplifier output signal while the power amplifier is operating under the operational parameter and while the power amplifier input signal received by the power amplifier is based on a second non-predistorted signal;
a storage module configured to store the optimized quiescent drain current value and the set of calibrated drain current values as saved drain current data; and
a power amplifier operation module configured to compare a present drain current value of the drain current to a particular drain current value in the saved drain current data while the power amplifier input signal received by the power amplifier is based on a predistorted signal, determine whether the comparing the present drain current value to the particular drain current value satisfies a condition, and adjust the drain current based on the particular drain current value if the condition is determined to be satisfied.

16. The system of claim 15, wherein the predistorted signal is generated by a predistorter module configured to detect existing distortion in an initial signal and to generate the predistorted signal based on the detected existing distortion.

17. The system of claim 15, wherein the first non-predistorted signal or the second non-predistorted signal is generated by disabling generation of the predistorted signal by a predistorter module.

18. The system of claim 17, further comprising a predistorter control module configured to disable generation of the predistorted signal by the predistorter module.

19. The system of claim 17, further comprising a predistorter control module configured to enable generation of the predistorted signal by the predistorter module.

20. The system of claim 15, wherein the power amplifier is a GaN power amplifier.

21. The system of claim 15, wherein the operational parameter comprises a plurality of operational parameters.

22. The system of claim 15, wherein the operational parameter comprises a frequency of the power amplifier input signal, a phase of the power amplifier input signal, a power level of the power amplifier input signal, or a temperature of the power amplifier.

23. The system of claim 15, wherein storing the optimized quiescent drain current value comprises storing the optimized quiescent drain current value in association with the operational parameter.

24. The system of claim 15, wherein storing the set of calibrated drain current values comprises storing the set of calibrated drain current values in association with the operational parameter or the set of power levels.

25. The system of claim 15, wherein the condition is that a difference between the present drain current value and the particular drain current value in the saved drain current data is less than, equal to, or larger than a predetermined value.

26. The system of claim 15, wherein adjusting the drain current based on the particular drain current value comprises adjusting the drain current to match or substantially match the particular drain current value in the saved drain current data.

27. The system of claim 15, wherein adjusting the drain current based on the drain current value comprises adjusting a voltage bias of the power amplifier such that the drain current matches or substantially matches the particular drain current value in the saved drain current data.

* * * * *